United States Patent
Grube et al.

(10) Patent No.: US 9,213,742 B2
(45) Date of Patent: Dec. 15, 2015

(54) TIME ALIGNED TRANSMISSION OF CONCURRENTLY CODED DATA STREAMS

(75) Inventors: Gary W. Grube, Barrington Hills, IL (US); Timothy W. Markison, Mesa, AZ (US)

(73) Assignee: Cleversafe, Inc., Chicago, IL (US)

( * ) Notice: Subject to any disclaimer, the term of this patent is extended or adjusted under 35 U.S.C. 154(b) by 795 days.

(21) Appl. No.: 13/565,636

(22) Filed: Aug. 2, 2012

(65) Prior Publication Data

US 2013/0060777 A1    Mar. 7, 2013

Related U.S. Application Data

(60) Provisional application No. 61/531,317, filed on Sep. 6, 2011.

(51) Int. Cl.
| | | |
|---|---|---|
| *H03M 13/00* | (2006.01) | |
| *G06F 17/30* | (2006.01) | |
| *H03M 13/11* | (2006.01) | |

(52) U.S. Cl.
CPC ..... *G06F 17/30516* (2013.01); *H03M 13/1148* (2013.01)

(58) Field of Classification Search
CPC .................. G06F 17/30516; H03M 13/1148
See application file for complete search history.

(56) References Cited

U.S. PATENT DOCUMENTS

| | | | |
|---|---|---|---|
| 4,092,732 A | 5/1978 | Ouchi | |
| 5,454,101 A | 9/1995 | Mackay et al. | |
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |

(Continued)

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

(Continued)

*Primary Examiner* — M. Mujtaba K Chaudry
(74) *Attorney, Agent, or Firm* — Garlick & Markison; Timothy W. Markison

(57) ABSTRACT

A method begins by a dispersed storage (DS) processing module receiving a first coded matrix that includes a first plurality of pairs of coded values corresponding to first data segments of a first data stream and a second data stream. The method continues with the DS processing module receiving a second coded matrix that includes a second plurality of pairs of coded values corresponding to first data segments of a third data stream and a fourth data stream. The method continues with the DS processing module generating a new coded matrix to include a plurality of groups of selected coded values. The method continues with the DS processing module outputting the plurality of groups of selected coded values to a requesting entity in a manner to maintain time alignment of the first data segments of the first, second, third, and fourth data streams.

14 Claims, 19 Drawing Sheets

(56) References Cited

U.S. PATENT DOCUMENTS

| | | |
|---|---|---|
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0147219 A1* | 7/2006 | Yoshino et al. ............... 398/183 |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2010/0091842 A1* | 4/2010 | Ikeda et al. ............... 375/240.03 |
| 2010/0180176 A1* | 7/2010 | Yosoku et al. ............... 714/752 |
| 2011/0053639 A1* | 3/2011 | Etienne Suanez et al. 455/556.1 |
| 2012/0051208 A1* | 3/2012 | Li et al. ............... 370/208 |
| 2012/0106595 A1* | 5/2012 | Bhattad et al. ............... 375/146 |

OTHER PUBLICATIONS

Shamir; How to Share a Secret; Communications of the ACM; vol. 22, No. 11; Nov. 1979; pp. 612-613.

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

* cited by examiner

FIG. 9A

| received coded matrix 180 col 1 | received coded matrix 180 col 2 | received coded matrix 180 col 3 | received coded matrix 180 col 4 | ••• | received coded matrix 180 col 40k-1 | received coded matrix 180 col 40k | |
|---|---|---|---|---|---|---|---|
| d1 1_1 | d2 1_1 | d1 2_1 | d2 2_1 | ••• | d1 20k_1 | d2 20k_1 | row 1 |
| d1 1_2 | d2 1_2 | d1 2_2 | d2 2_2 | ••• | d1 20k_2 | d2 20k_2 | row 2 |
| d1 1_3 | d2 1_3 | d1 2_3 | d2 2_3 | ••• | d1 20k_3 | d2 20k_3 | row 3 |
| d1 1_4 | d2 1_4 | d1 2_4 | d2 2_4 | ••• | d1 20k_4 | d2 20k_4 | row 4 |
| d1 1_5 | d2 1_5 | d1 2_5 | d2 2_5 | ••• | d1 20k_5 | d2 20k_5 | row 5 |
| d1 1_6 | d2 1_6 | d1 2_6 | d2 2_6 | ••• | d1 20k_6 | d2 20k_6 | row 6 |
| d1 1_7 | d2 1_7 | d1 2_7 | d2 2_7 | ••• | d1 20k_7 | d2 20k_7 | row 7 |
| d1 1_8 | d2 1_8 | d1 2_8 | d2 2_8 | ••• | d1 20k_8 | d2 20k_8 | row 8 |

FIG. 9B

| received coded matrix 180 col 1 | received coded matrix 180 col 2 | received coded matrix 180 col 3 | received coded matrix 180 col 4 | ••• | received coded matrix 180 col 40k-1 | received coded matrix 180 col 40k | |
|---|---|---|---|---|---|---|---|
| d1 1_1 | d2 1_1 | | | ••• | d1 20k_1 | d2 20k_1 | row 1 |
| d1 1_2 | d2 1_2 | d1 2_2 | | ••• | d1 20k_2 | d2 20k_2 | row 2 |
| d1 1_3 | | d1 2_3 | | ••• | d1 20k_3 | d2 20k_3 | row 3 |
| d1 1_4 | d2 1_4 | d1 2_4 | | ••• | d1 20k_4 | d2 20k_4 | row 4 |
| d1 1_5 | d2 1_5 | | d2 2_5 | ••• | d1 20k_5 | d2 20k_5 | row 5 |
| | d2 1_6 | d1 2_6 | d2 2_6 | ••• | d1 20k_6 | | row 6 |
| | | d1 2_7 | d2 2_7 | ••• | | | row 7 |
| | | | d2 2_8 | ••• | | | row 8 |

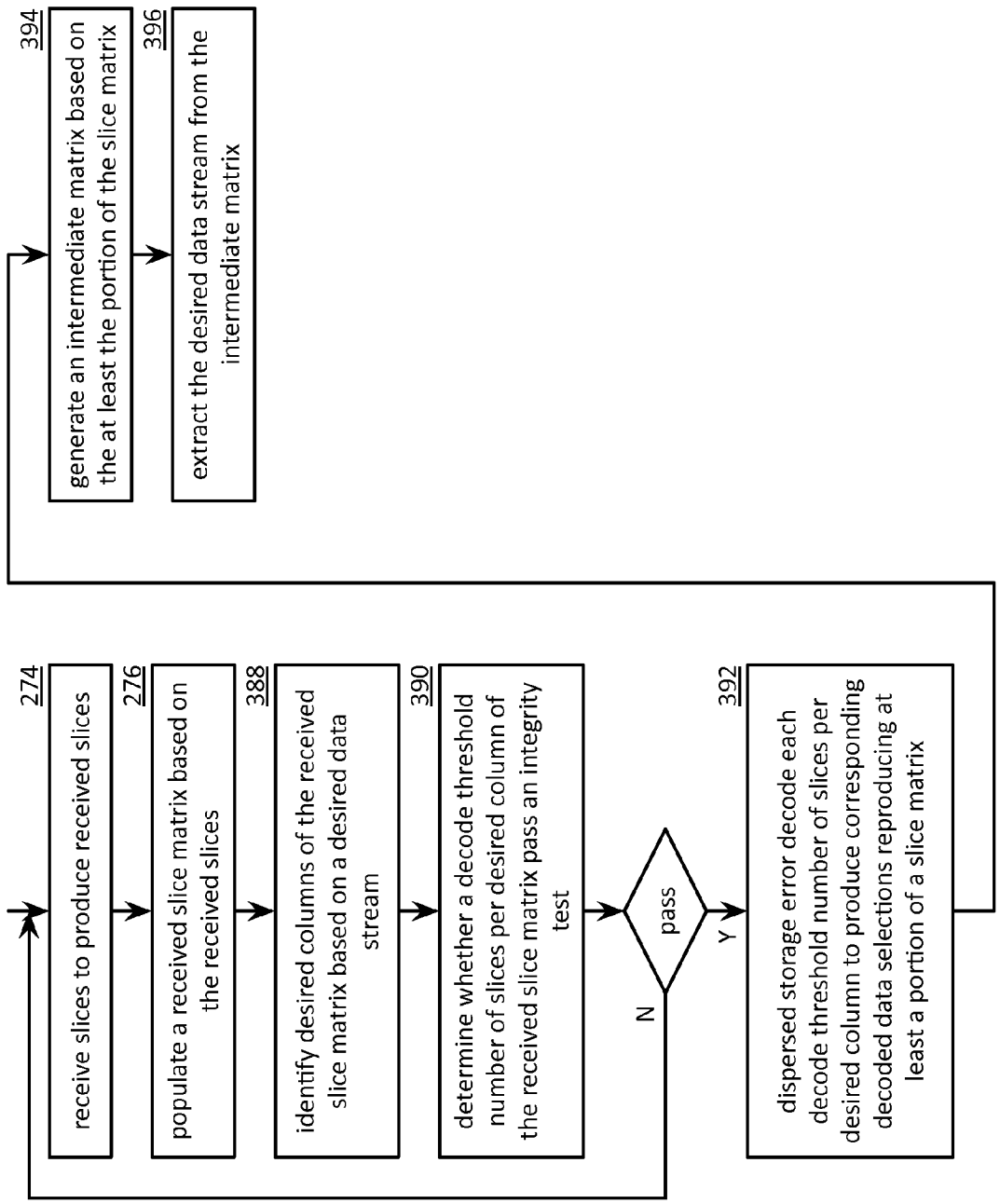

TIME ALIGNED TRANSMISSION OF CONCURRENTLY CODED DATA STREAMS

CROSS REFERENCE TO RELATED PATENTS

The present U.S. Utility patent application claims priority pursuant to 35 U.S.C. §119(e) to U.S. Provisional Application No. 61/531,317, entitled "Communicating One or More Data Streams Utilizing Dispersed Storage Error Encoding," filed Sep. 6, 2011, which is incorporated herein by reference in its entirety and made part of the present U.S. Utility patent application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failure issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 9A is a diagram illustrating an example of a plurality of received coded matrices in accordance with the invention;

FIG. 9B is a diagram illustrating another example of a plurality of received coded matrices in accordance with the invention;

FIG. 17 is a flowchart illustrating another example of receiving data in accordance with the invention.

DETAILED DESCRIPTION OF THE INVENTION

Figure 1:
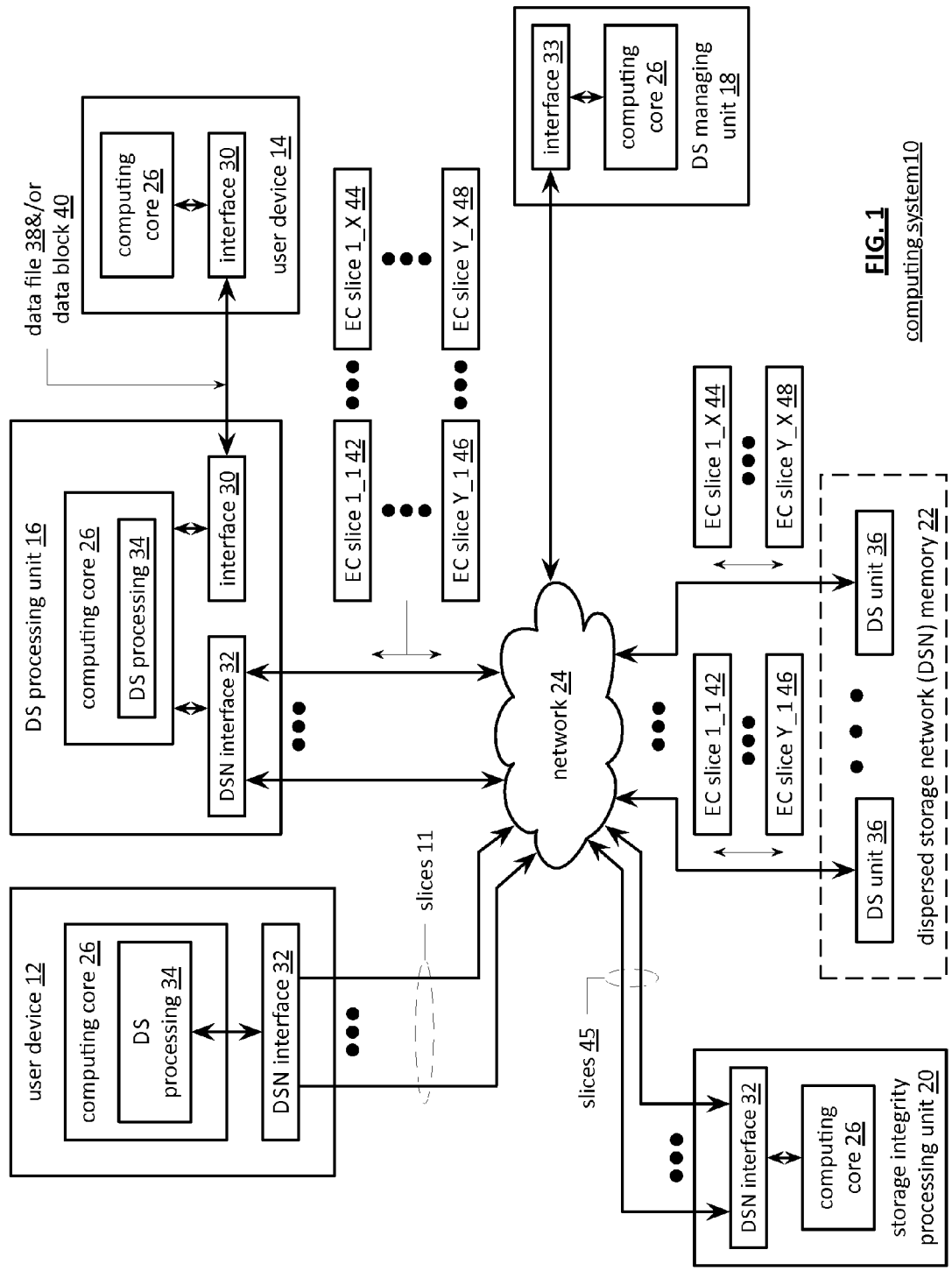
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.).

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 indirectly and/or directly. For example, interfaces 30 support a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or unitS' activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security.

Each DS unit 36 that receives an EC slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
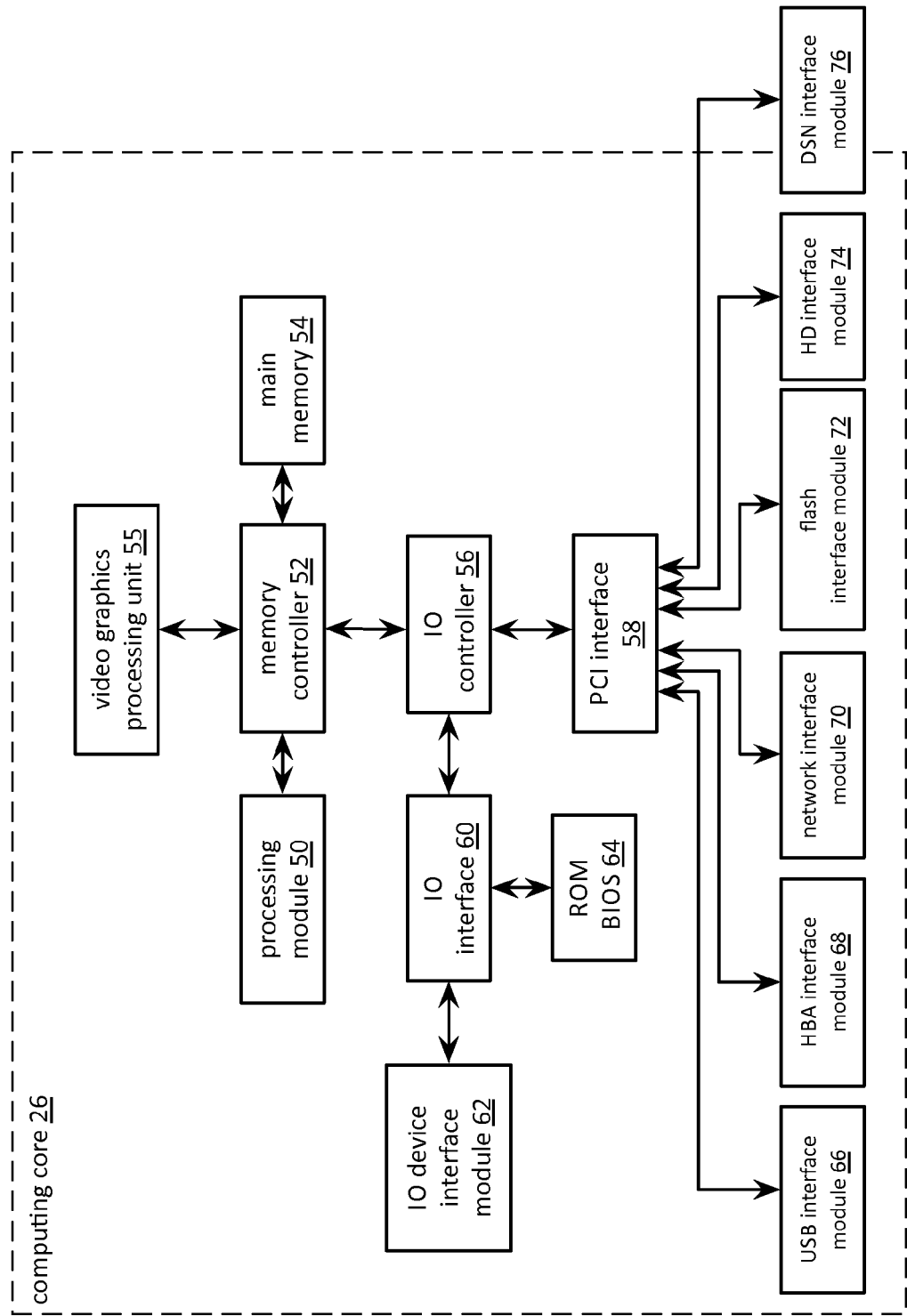
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
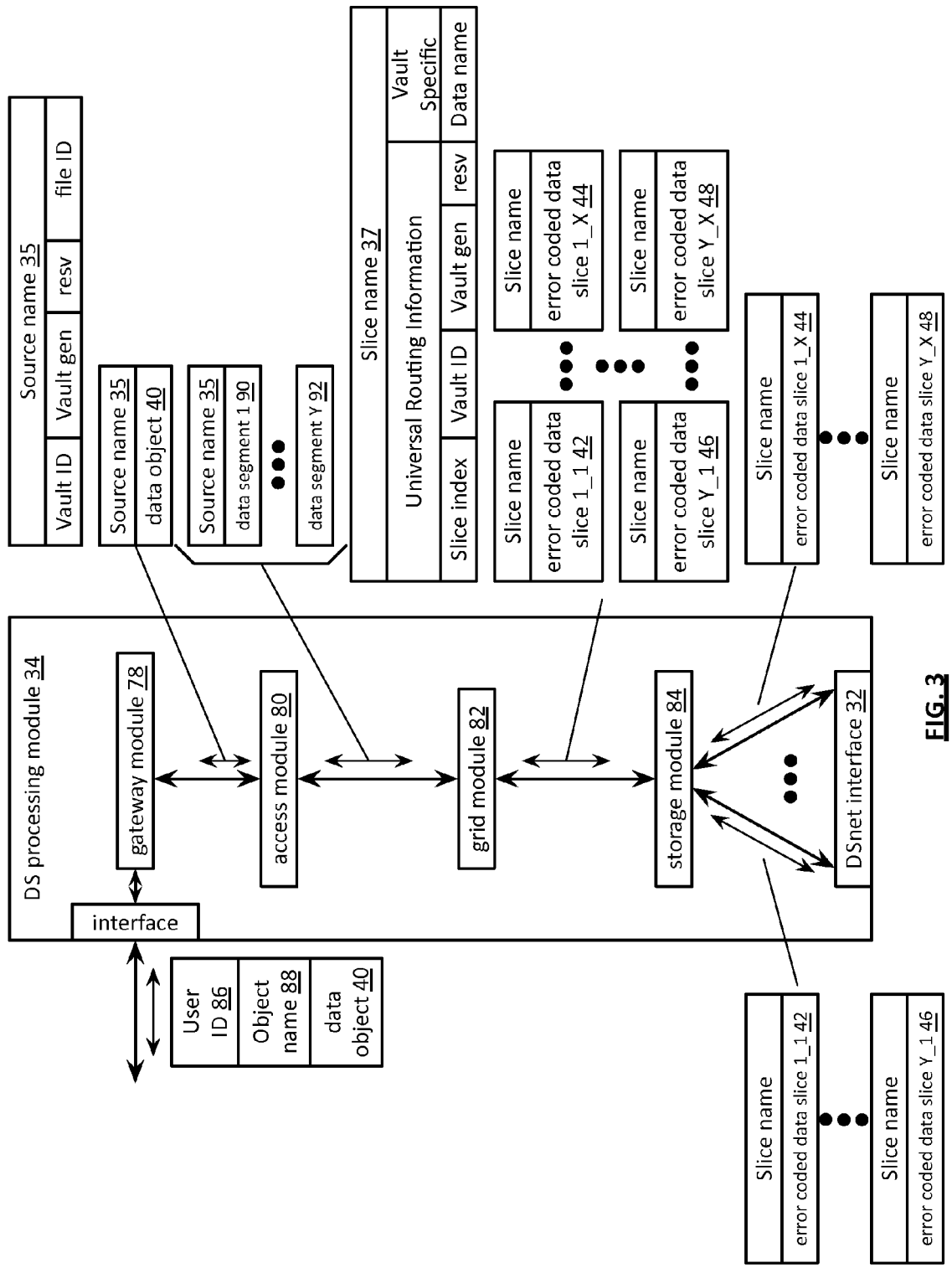
FIG. 3 is a schematic block diagram of an embodiment of a distributed storage processing unit in accordance with the invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user device 12 or of the DS processing unit 16. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the DS managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment size is fixed, then the number of segments Y varies based on the size of data object. For instance, if the data object is an image file of 4,194,304 bytes and the fixed size of each segment is 4,096 bytes, then the number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 16, which authenticates the request. When the request is authentic, the DS processing unit 16 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figure 4:
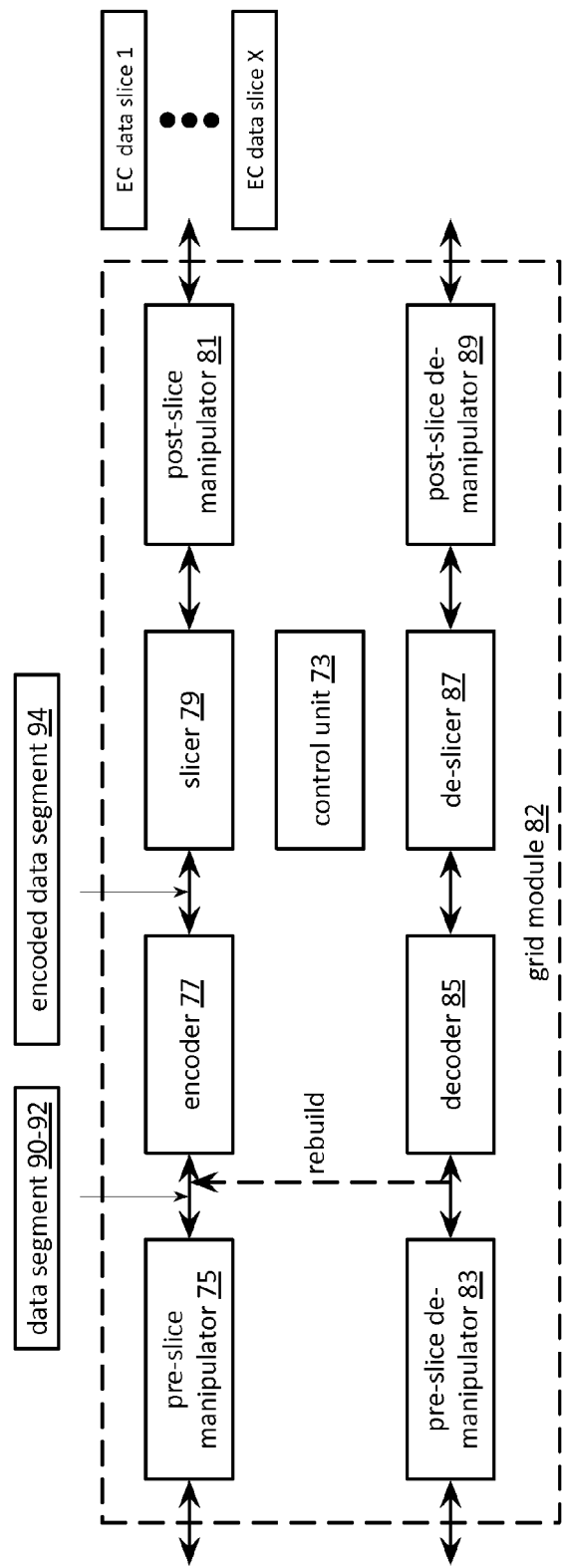
FIG. 4 is a schematic block diagram of an embodiment of a grid module in accordance with the invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X−T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

Figure 5:
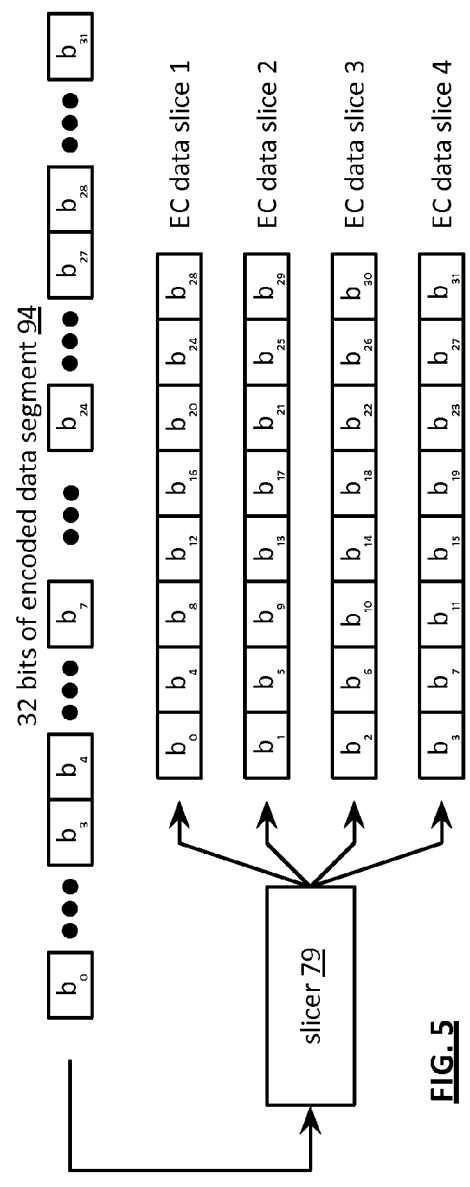
FIG. 5 is a diagram of an example embodiment of error coded data slice creation in accordance with the invention.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
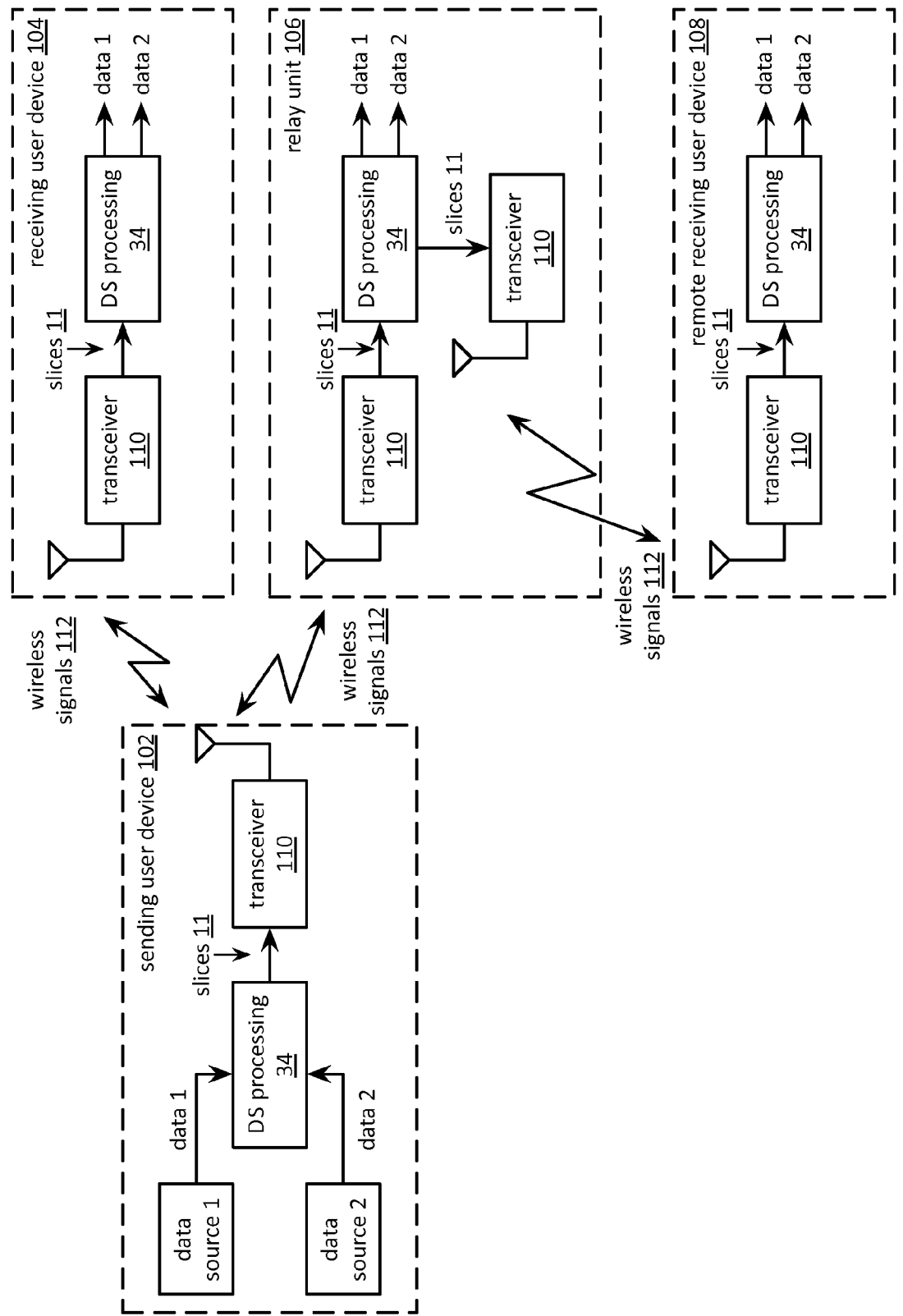
FIG. 6 is a schematic block diagram of another embodiment of a computing system in accordance with the invention.

FIG. 6 is a schematic block diagram of another embodiment of a computing system that includes a sending user device 102, a receiving user device 104, a relay unit 106, and a remote receiving user device 108. The system may include any number of sending user devices 102, any number of receiving user devices 104, any number of relay units 106, and any number of remote receiving user devices 108. The sending user device 102 includes data sources 1 and 2, a dispersed storage (DS) processing 34, and a transceiver 110. The receiving user device 104 includes the transceiver 100 and the DS processing 34. The relay unit 106 includes a first transceiver 110, a second transceiver 110, and the DS processing 34. The remote receiving user device 108 includes the transceiver 110 and the DS processing 34.

The transceiver 110 communicates wireless signals 112 and may operate in accordance with one or more wireless industry standards including universal mobile telecommunications system (UMTS), global system for mobile communications (GSM), long term evolution (LTE), wideband code division multiplexing (WCDMA), IEEE 802.11, IEEE 802.16, WiMax, Bluetooth, Association of Public Safety Communications Officers (APCO) Project 25, or any other local area network (LAN), wide area network (WAN), personal area network (PAN) or like wireless protocol. The wireless signals 112 may be transmitted in accordance with any one of a broadcast scheme, a unicast scheme, and a multicast scheme. Alternatively, or in addition to, the sending user device 102, the receiving user device 104, the relay unit 106, and the remote receiving user device 108 communicate utilizing wireline communications.

The DS processing 34 of the sending user device 102 receives data 1 from data source 1 and data 2 from data source 2. Alternatively, the DS processing 34 receives any number of data (e.g., three or more data streams) from any number of data sources. The data sources 1-2 includes at least one of a signal processor, a receiver output, a video switch output, an audio switch output, a record systems output, a memory device, a computer, a server, a router output, and a memory system. The data includes at least one of an audio stream, a video stream, a text stream, a data file, a two way radio dispatch audio stream. Each data source may be sourced concurrently to facilitate time synchronization. For example, data 1 may include images and video clips and data 2 may include time aligned audio clips. As another example, data 1 may include police two way radio group dispatch audio and data 2 may include associated information including at least one of on-scene imaging, location information, records files, and assisting police officer resource information.

The DS processing 34 of the sending user device 102 dispersed storage error encodes data 1-2 to produce slices 11. The method of operation of the DS processing 34 is discussed in greater detail with reference to FIGS. 7-17. The transceiver 110 of the sending user device 102 communicates the slices 11 as wireless signals 112 to at least one of the receiving user device 104 and the relay unit 106.

The transceiver 110 of the receiving user device 104 receives the wireless signals 112 from the sending user device 102 to facilitate reproduction of the slices 11. The DS processing 34 of the receiving user device 104 dispersed storage error decodes the slices 11 to reproduce data 1-2. The receiving user device 104 may consume data 1-2 including one or more of storing data 1-2, displaying information based on data 1-2, and enunciating information based on data 1-2 (e.g., via a user interface).

The first transceiver 110 of the relay unit 106 receives the wireless signals 112 from the sending user device 102 to facilitate reproduction of the slices 11. The DS processing 34 of the relay unit 106 dispersed storage error decodes the slices 11 to reproduce data 1-2. The relay unit 106 may consume data 1-2 including one or more of further processing data 1-2 as slices 11, storing data 1-2, displaying information based on data 1-2, and enunciating information based on data 1-2. The relay unit 106 may further process the data 1-2 to include at least one of selecting at least one data stream, compressing at least one data stream, combining two or more data streams, multiplexing at least one data stream with data retrieved from a local memory, and multiplexing at least one data stream with a locally generated data stream. The DS processing 34 of the relay unit 106 sends further processed slices 11 to the second transceiver 110 of the relay unit 106. The second transceiver 110 of the relay unit 106 communicates the further processed slices 11 as wireless signals 112 to the remote receiving user device 108. The method of operation of the relay unit is discussed in greater detail with reference to FIGS. 16A and 16B.

The transceiver 110 of the remote receiving user device 108 receives the wireless signals 112 from the relay unit 106 and reproduces the further processed slices 11. The DS processing 34 of the remote receiving user device 108 dispersed storage error decodes the further processed slices 11 to reproduce at least one of data 1-2 and further processed data. The remote receiving user device 108 may consume data 1-2 and the further processed data including one or more of storing, displaying information, and enunciating information.

Figure 7:
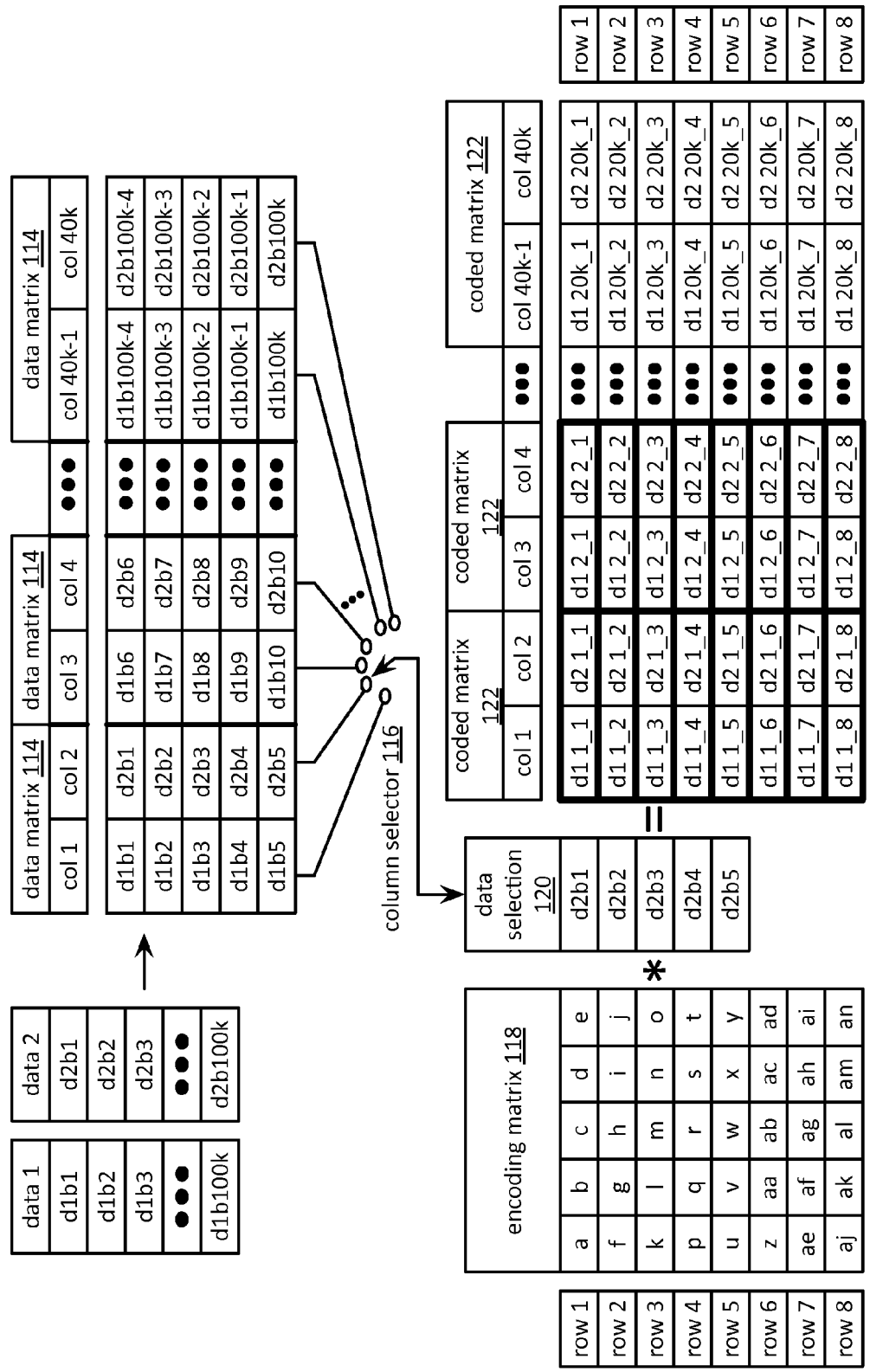
FIG. 7 is a diagram illustrating an example of a data encoding scheme in accordance with the invention.

FIG. 7 is a diagram illustrating an example of a data encoding scheme. The scheme encodes two or more data streams data 1 and data 2 to produce a plurality of coded values for transmission to one or more receiving entities. The scheme includes the two or more data streams, one or more data matrices 114, a column selector 116, an encoding matrix 118, a data selection 120, and one or more corresponding coded matrices 122. The data stream includes two or more pluralities of data bytes. For example, data 1 includes 100,000 bytes $d1b1$-$d1b100k$ and data 2 includes 100,000 bytes $d2b1$-$d2b100k$. The one or more data matrices 114 include overall dimensions (e.g., number of rows, number of columns) based on a size of data 1-2 and error coding dispersal storage function parameters (e.g., a decode threshold). For example, the overall dimensions includes five rows and 40,000 columns, when the error coding dispersal storage function parameters includes a decode threshold of five and a data 1-2 size of 100,000 bytes each (e.g., columns=data 1-2 size/decode threshold=$200k/5=40k$).

Each of the first and second data streams are segmented to produce a first plurality of data segments corresponding to the first data stream (e.g., data 1) and a second plurality of data segments corresponding to the second data stream (e.g., data 2). For example, the first data stream is segmented as bytes are received to produce the first plurality of data segments such that each data segment includes five bytes when the decode threshold is five. A first data segment of the first plurality of data segments may be divided into a first plurality of data blocks (e.g., one or more bytes per data block) and a first data segment of the second plurality of data segments may be divided into a second plurality of data blocks such that the first data segment of the first plurality of data segments is time aligned with the first data segment of the second plurality of data segments. The data matrix 114 is created by placing first time corresponding data blocks of the first and second plurality of data blocks into a first row of the data matrix and placing second time corresponding data blocks of the first and second plurality of data blocks into a second row of the data matrix.

Each data matrix 114 includes alternating entries between bytes of data 1 and data 2 of sequential data bytes of data 1-2 in a column-by-column fashion. For example, column 1 starts with data 1 and includes bytes d1$b$1-d1$b$5, column 2 alternates to data 2 and includes bytes d2$b$1-d2$b$5, column 3 alternates back to data 1 and includes bytes d1$b$6-d1$b$10, etc. when each data block includes one byte. Such an alternating encoding scheme facilitates subsequent time synchronization between data 1-2.

The encoding matrix 118 includes matrix dimensions based on the error coding dispersal storage function parameters (e.g., the decode threshold, a width). For example, the encoding matrix 118 includes five columns and eight rows when the decode threshold is five and the pillar width is eight. The encoding matrix 118 includes entries in accordance with an error coding dispersal storage function to produce encoded data slices (e.g., coded values) such that at least a decode threshold number of encoded data slices may be utilized to subsequently reproduce the data.

The data selection 120 includes matrix dimensions of one by the decode threshold (e.g., one by five when the decode threshold is five). The column selector 116 forms entries of the data selection one point based on selecting data of each column of the plurality of data matrices 114 one by one. For example, the column selector selects a second selection of column 2 to include bytes d2$b$1-d2$b$5.

The plurality of coded matrices 122 includes overall matrix dimensions of the width number of rows (e.g., pillars) and a number of columns is substantially the same as the number of columns of the overall dimensions of the plurality of data matrices 114. The plurality of coded matrices 122 includes entries that form a width number (e.g., a number of rows of each coded matrix 122) of encoded data slices.

In an example of operation, the column selector 116 selects a first column of a first data matrix 114 to produce a first data selection 120 of a plurality of data selections. The encoding matrix 118 is matrix multiplied by each data selection 120 of the plurality of data selections to produce a corresponding first column of a first coded matrix 122. For example, d1_1=a*d1$b$1+b*d1$b$2+c*d1$b$3+d*d1$b$4+e*d1$b$5 when the column selector 116 selects the first column of the first data matrix 114. As another example, d2_2_8=aj*d2$b$6+ak*d2$b$7+al*d2$b$8+am*d2$b$9+an*d2$b$10 when the column selector 116 selects a second column (e.g., a fourth overall column of the plurality of data matrices 114) of a second data matrix 114.

Coded value pairs (e.g. slice pairs) may be formed from each coded matrix 122 and transmitted to at least one receiving entity to provide a reliable transmission of the data 1-2. Coded values from at least a decode threshold number of rows are to be transmitted such that corresponding data selections may be reproduced by decoding a decode threshold number of bytes corresponding to a common column. Coded value pairs (e.g., first and second column bytes of each coded matrix 122) may be transmitted row by row to facilitate substantially simultaneous reception of a decode threshold number of coded values of each data stream by the at least one receiving entity. Alternatively, at least a decode threshold number of sequential bytes of each column of each coded matrix 122 may be transmitted one column at a time to facilitate reception of a decode threshold number of coded values of a first data stream ahead of a second data stream.

More than a decode threshold number of bytes per column may be transmitted when at least one of the decode threshold number of bytes was not received by at least one receiving entity. For example, bytes of column 1 corresponding to rows 1-5 are transmitted and all bytes except the byte of row 3 are received by the receiving entity. Any one of bytes corresponding to rows 3, 6-8 may be transmitted to the receiving entity such that the receiving entity completes receiving a decode threshold number of bytes corresponding to column 1. The method of operation of a transmitting entity is discussed in greater detail with reference to FIG. 8B.

Figure 8A:
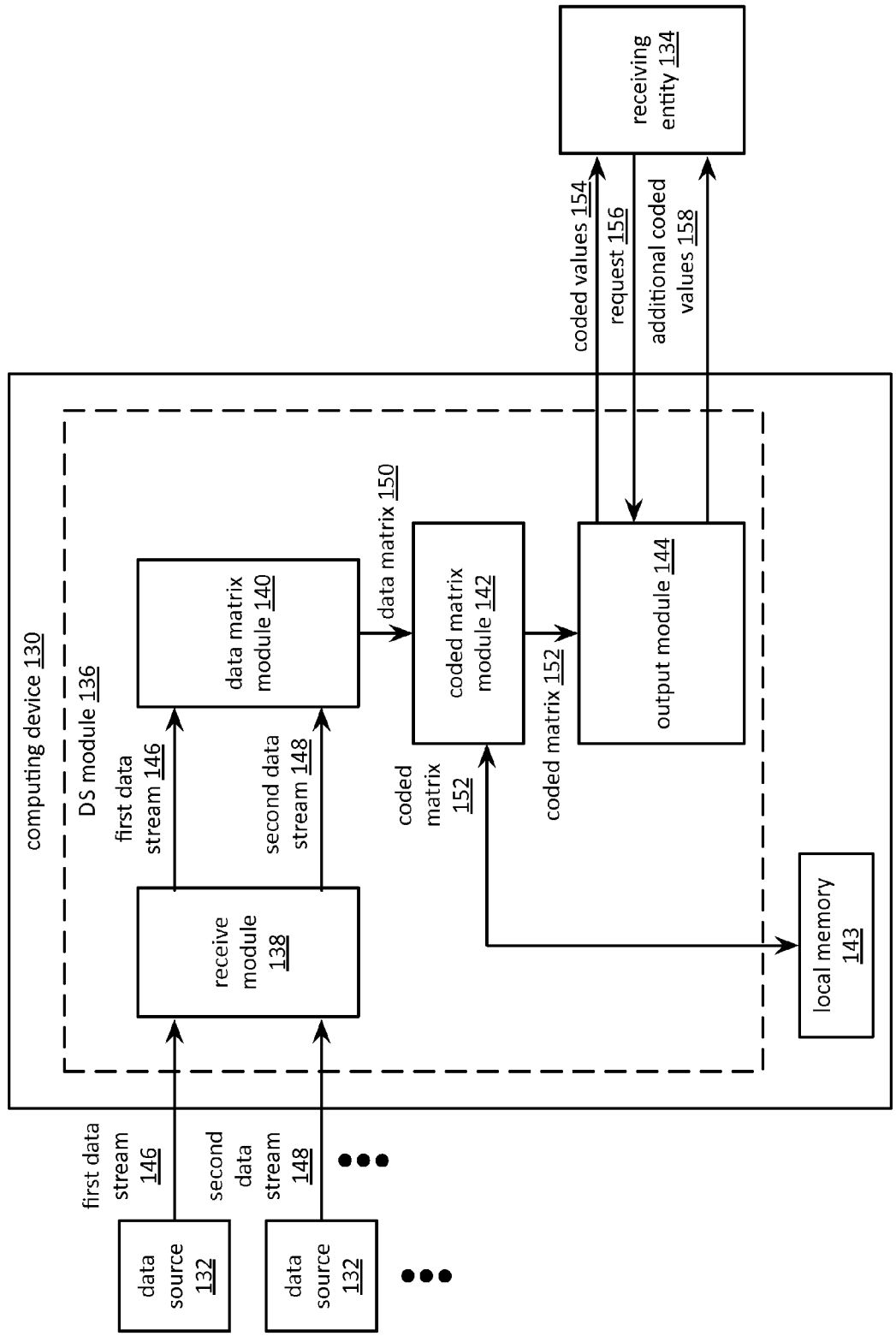
FIG. 8A is a schematic block diagram of another embodiment of a computing system in accordance with the invention.

FIG. 8A is a schematic block diagram of another embodiment of a computing system that includes a computing device 130, a plurality of data sources 132, and a receiving entity 134. The receiving entity 134 includes at least one of a receiving user device 104 and a relay unit 106. The computing device 130 includes a dispersed storage (DS) module 136 and a local memory 143. The local memory 143 may include one or more memory devices, wherein a memory device of the one or more member devices includes at least one of solid-state random access memory, optical disc memory, and a magnetic disk memory. The DS module 136 includes a receive module 138, a data matrix module 140, a coded matrix module 142, and an output module 144.

A first data source 132 of the plurality of data sources 132 provides a first data stream 146 (e.g., data 1) and a second data source 132 of the plurality of data sources 132 provides a second data stream 148 (e.g., data 2) to the computing device 130 for time synchronized transmission to the receiving entity 134. The first data stream 146 may correspond to a first recording of an environment and the second data stream may correspond to a second recording of the environment. The first and second recordings include at least one of audio, video, instrumented data, and a series of still pictures. The environment includes one or more of a physical space (e.g., a room, an outdoor area, a highway intersection, etc.) and a status and/or condition (e.g., a police work ticket list, a jobsite activity list, results of a sporting event, etc.). The receive module 138 concurrently receives the first data stream 146 and the second data stream 148 for transmission to the receiving entity 134. For example, the receive module 138 concurrently receives the first data stream 146 and the second data stream 148 in a time synchronized fashion byte by byte.

The data matrix module 140 segments each of the first and second data streams to produce a first plurality of data segments corresponding to the first data stream 146 and a second plurality of data segments corresponding to the second data stream 148. For example, the data matrix module 140 segments the first data stream 146 as bytes are received to produce the first plurality of data segments such that each data segment includes a predetermined data segment number of bytes. The data matrix module 140 divides one of the first plurality of data segments into a first plurality of data blocks and divides one of the second plurality of data segments into a second plurality of data blocks such that the one of the first plurality of data segments is time aligned with the one of the second plurality of data segments. The data matrix module 140 creates a data matrix 150 from the first and second plurality of data blocks. The data matrix module 140 functions to create the data matrix by placing first time corresponding data blocks of the first and second plurality of data blocks into a first row of the data matrix and placing second time corresponding data blocks of the first and second plurality of data blocks into a second row of the data matrix.

The coded matrix module 142 generates a coded matrix 152 from the data matrix 150 and an encoding matrix. The encoding matrix includes at least one of a Reed-Solomon based encoding matrix, an on-line coding based matrix, a Cauchy Reed-Solomon based encoding matrix, a forward error correction based matrix, and an erasure code based matrix. For example, the coded matrix module 142 matrix multiplies the data matrix 150 by the encoding matrix to produce the coded matrix 152. The coded matrix module 142 further functions to locally store the coded matrix 152 for a given period of time. For example, the coded matrix module 142 stores the coded matrix 152 in a local memory associated with the computing device 130 for a minimum time period of 24 hours, The output module 144 outputs one or more pairs of coded values 154 of the coded matrix 152 to the receiving entity 134, wherein a pair of coded values of the one or more pairs of coded values 154 includes a coded value corresponding to the one of the first plurality of data segments and a coded value corresponding to the one of the second plurality of data segments. The output module 144 functions to output the one or more pairs of coded values 154 in a variety of ways. In a first way, the output module 144 functions to output the one or more pairs of coded values 154 by outputting pairs of coded values 154 of the coded matrix 152 in a sequential order corresponding to a time ordering of the first and second plurality of data blocks such that the receiving entity 134 is able to decode the pairs of coded values 154 to maintain concurrency of the first and second data streams 146 and 148.

In a second way, the output module 144 functions to output the one or more pairs of coded values 154 by outputting a decode threshold number of pairs of coded values of the coded matrix 152 such that the receiving entity 134 is able to decode coded values of the decode threshold number of pairs of coded values associated with the one of the first plurality of data segments to recapture the one of the first plurality of data segments and is able to decode coded values of the decode threshold number of pairs of coded values associated with the one of the second plurality of data segments to recapture the one of the second plurality of data segments. In a third way, the output module 144 functions to output the one or more pairs of coded values 154 by receiving a request 156 for one or more additional pairs of coded values 158 from the receiving entity 134 and outputting the one or more additional pairs of coded values 158 to the receiving entity 134 when the one or more additional pairs of coded values 158 are available.

The computing device 130 may receive any number of data streams from the plurality of data sources 132. The receive module 138 concurrently receives a third data stream with the first and second data streams 146 and 148 when a third data stream is provided by the plurality of data sources 132 for transmission to the receiving entity 134. The data matrix module 140 segments each of the first, second, and third data streams to produce the first plurality of data segments, the second plurality of data segments, and a third plurality of data segments corresponding to the third data stream. The data matrix module 140 divides one of the third plurality of data segments into a third plurality of data blocks such that the one of the third plurality of data segments is time aligned with the one of the first plurality of data segments and with the one of the second plurality of data segments. The data matrix module 140 creates the data matrix 150 from the first, second, and third plurality of data blocks. The coded matrix module 142 generates the coded matrix 142 from the data matrix 150 and the encoding matrix. The output module 144 outputs one or more trios of coded values 154 of the coded matrix 152 to the receiving entity 134, wherein a trio of coded values of the one or more trios of coded values includes the coded value corresponding to the one of the first plurality of data segments, the coded value corresponding to the one of the second plurality of data segments, and a coded value corresponding to the one of the third plurality of data segments.

Figure 8B:
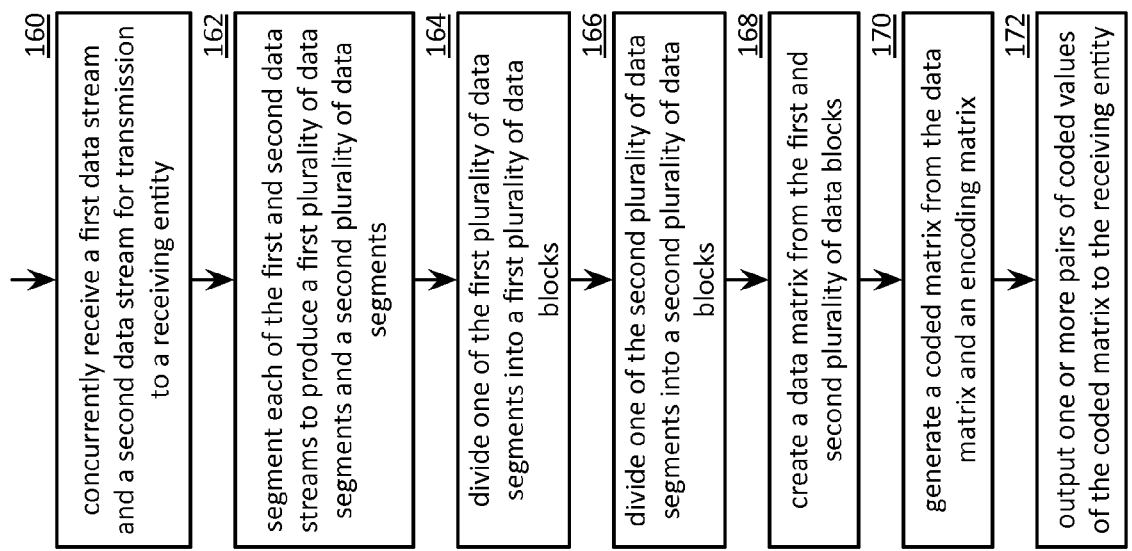
FIG. 8B is a flowchart illustrating an example of sending data in accordance with the invention.

FIG. 8B is a flowchart illustrating an example of sending data. The method begins at step 160 where a processing module (e.g., a dispersed storage (DS) processing module) concurrently receives a first data stream and a second data stream for transmission to a receiving entity. The method continues at step 162 where the processing module segments each of the first and second data streams to produce a first plurality of data segments corresponding to the first data stream and a second plurality of data segments corresponding to the second data stream. The method continues at step 164 where the processing module divides one of the first plurality of data segments into a first plurality of data blocks. For example, the processing module divides the one data segment into five data blocks when a data segment is five bytes and each data block is one byte. The method continues at step 166 where the processing module divides one of the second plurality of data segments into a second plurality of data blocks, wherein the one of the first plurality of data segments is time aligned with the one of the second plurality of data segments.

The method continues at step 168 where the processing module creates a data matrix from the first and second plurality of data blocks. The creating the data matrix includes placing first time corresponding data blocks of the first and second plurality of data blocks into a first row of the data matrix and placing second time corresponding data blocks of the first and second plurality of data blocks into a second row of the data matrix. The method continues at step 170 where the processing module generates a coded matrix from the data matrix and an encoding matrix. The encoding matrix includes at least one of a Reed-Solomon based encoding matrix, an on-line coding based matrix, a Cauchy Reed-Solomon based encoding matrix, a forward error correction based matrix, and an erasure code based matrix. For example, the processing module accesses a matrix lookup table to extract a coded matrix column based on the data matrix and a corresponding row of the encoding matrix. Alternatively, or in addition to, the processing module locally stores the coded matrix for a given period of time to facilitate subsequent transmission and/or retransmission of coded values to the receiving entity.

The method continues at step 172 where the processing module outputs one or more pairs of coded values of the coded matrix to the receiving entity, wherein a pair of coded values of the one or more pairs of coded values includes a coded value corresponding to the one of the first plurality of data segments and a coded value corresponding to the one of the second plurality of data segments. The processing module outputs at least a decode threshold number of pairs of coded values for each coded matrix 122. For example, the processing module outputs code value pairs 1-5 (e.g., of rows 1-5) to the receiving entity and waits for a message from the receiving entity. Next, the processing module receives a message that indicates no more coded values are required when each coded value pairs were successfully received by the receiving entity. Alternatively, the processing module receives a message that includes a request that indicates that more coded values are required when at least one coded value pair was not successfully received by the receiving entity.

The outputting the one or more pairs of coded values may be accomplished in a variety of ways. In a first way, the processing module outputs pairs of coded values of the coded matrix in a sequential order corresponding to a time ordering of the first and second plurality of data blocks such that the receiving entity is able to decode the pairs of coded values to maintain concurrency of the first and second data streams. In a second way, the processing module outputs a decode threshold number of pairs of coded values of the coded matrix such that the receiving entity is able to decode coded values of the decode threshold number of pairs of coded values associated with the one of the first plurality of data segments to recapture the one of the first plurality of data segments and is able to decode coded values of the decode threshold number of pairs of coded values associated with the one of the second plurality of data segments to recapture the one of the second plurality of data segments. In a third way, the processing module receives a request for one or more additional pairs of coded values from the receiving entity and outputs the one or more additional pairs of coded values to the receiving entity when the one or more additional pairs of coded values are available.

The processing module may code any number of data streams. In an example of operation of coding three data streams, the processing module concurrently receives a third data stream with the first and second data streams and segments each of the first, second, and third data streams to produce the first plurality of data segments, the second plurality of data segments, and a third plurality of data segments corresponding to the third data stream. The example continues with the processing module dividing one of the third plurality of data segments into a third plurality of data blocks such that the one of the third plurality of data segments is time aligned with the one of the first plurality of data segments and with the one of the second plurality of data segments. The example continues with the processing module creating the data matrix from the first, second, and third plurality of data blocks. The example continues with the processing module generating the coded matrix from the data matrix and the encoding matrix. The example continues with the processing module outputting one or more trios of coded values of the coded matrix to the receiving entity such that a trio of coded values of the one or more trios of coded values includes the coded value corresponding to the one of the first plurality of data segments, the coded value corresponding to the one of the second plurality of data segments, and a coded value corresponding to the one of the third plurality of data segments.

FIG. 9A is a diagram illustrating an example of a plurality of received coded matrices 180. Each received coded matrix 180 of the plurality of received coded matrices 180 is generated by a receiving entity receiving one or more coded value pairs (e.g., pairs of slices), extracting one or more coded values from each coded value pair of the plurality of coded value pairs, and populating the received coded matrix 180 with the one or more coded values in accordance with a decoding scheme. For example, the received coded matrix 180 is substantially the same as a corresponding coded matrix 122, when one or more coded value pairs are received without errors.

A decode threshold number of blocks (e.g., bytes when a block is one byte) of each column of the received coded matrix 180 are decoded (e.g., dispersed storage error decoded) to produce a corresponding column of a corresponding data matrix 114. For example, the decode threshold number of bytes are matrix multiplied by an inverted square matrix (e.g., a pillar width minus a threshold number of decode rows are eliminated to produce a square matrix) of corresponding rows of an encoding matrix to produce the corresponding column of the data matrix 114.

FIG. 9B is a diagram illustrating another example of a plurality of received coded matrices 180. Each received coded matrix 180 of the plurality of received coded matrices 180 is generated by a receiving entity receiving one or more coded value pairs (e.g., pairs of slices), extracting one or more coded values from each coded value pair of the plurality of coded value pairs, and populating the received coded matrix 180 with the one or more coded values in accordance with a decoding scheme. For example, the received coded matrix 180 is substantially not the same as a corresponding coded matrix 122, when one or more coded value pairs are received with errors (e.g., one or more missing coded values due to communication errors). The receiving entity identifies one or more missing coded values and sends a message to a sending entity to send one or more additional coded values such that a decode threshold number of coded value pairs per column of the received coded matrix 180 are successfully received.

The receiving entity analyzes each column of the received coded matrix 180 to determine how to generate a message for communicating to the sending entity. For example, the receiving entity sends a message to the sending entity indicating that no more coded values corresponding to column 1 of a first received coded matrix 180 are required when bytes d1 1_1 through d1 1_5 were successfully received and validated (e.g., calculated integrity information favorably compares to a received integrity value). As another example, the receiving entity sends a message to the sending entity indicating that one additional coded value corresponding to column 2 is required when bytes d2 1_1, d2 1_2, d2 1_4, and d2 1_5 were successfully received. Next, the receiving entity receives byte d2 1_6 corresponding to column 2 to complete a decode threshold number of coded values corresponding to column 2. Similarly, the receiving entity acquires bytes 6 and 7 of column 3 in a second receiving step when bytes 1 and 5 were missing from a first receiving step. As yet another example, the receiving entity sends a message to the sending entity indicating that at least one additional coded value corresponding to column 40$k$-1 is required since bytes 1-5 of column 40$k$-1 produced a decoded data segment that failed an integrity test. Next, the receiving entity receives byte d1 20$k$_6 to utilize in combination with bytes 1-5 to attempt to decode a decode threshold number of coded values that passes the integrity test. The method of operation of the receiving entity is discussed in greater detail with reference to FIGS. 10A-B.

Figure 10A:
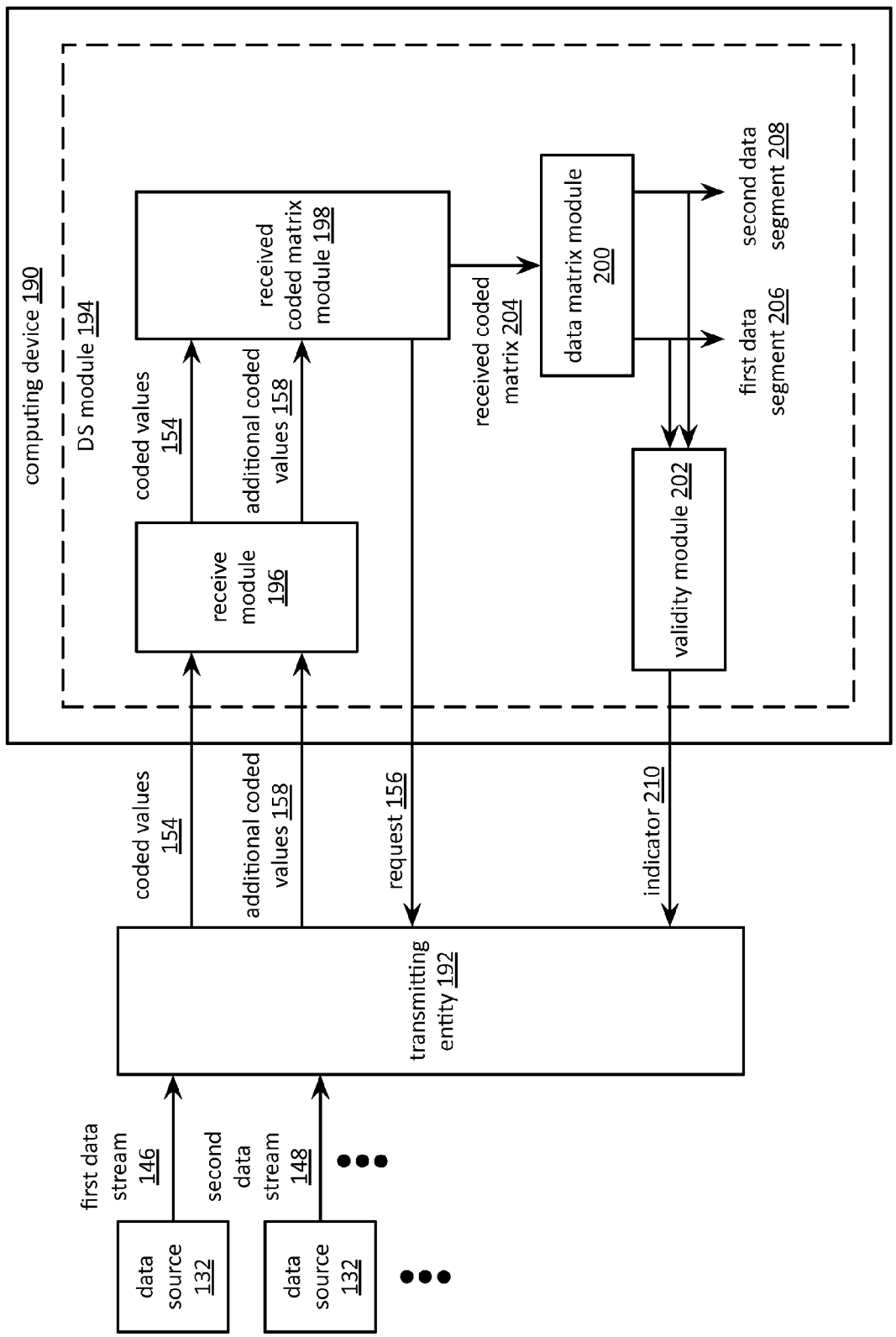
FIG. 10A is a schematic block diagram of another embodiment of a computing system in accordance with the invention.

FIG. 10A is a schematic block diagram of another embodiment of a computing system that includes a computing device 190, a plurality of data sources 132, and a transmitting entity 192. The transmitting entity 192 includes at least one of a sending user device 102 and a relay unit 106. The computing device 190 includes a dispersed storage (DS) module 194. The DS module 194 includes a receive module 196, a received coded matrix module 198, a data matrix module 200, and a validity module 202.

The transmitting entity 192 time aligns a first data stream 146 and a second data stream 148 segmenting the first and second data streams to produce a first plurality of data segments corresponding to the first data stream 146 and a second plurality of data segments corresponding to the second data stream 148. The first data stream may correspond to a first recording of an environment and the second data stream may correspond to a second recording of the environment. The transmitting entity 192 transmits one or more pairs of coded values 154, wherein a pair of coded values of the one or more pairs of coded values 154 includes a coded value corresponding to one of the first plurality of data segments 206 and a coded value corresponding to one of the second plurality of data segments 208.

The received module 196 receives the one or more pairs of coded values. The received coded matrix module 198 creates a received coded matrix 204 from the one or more pairs of coded values 154. The received coded matrix module 198 functions to create the received coded matrix 204 from the one or more pairs of coded values 154 by inputting pairs of coded values into the received coded matrix 204 in a sequential order corresponding to a time ordering of the one of the first plurality of data segments 206 and the one of the second plurality of data segments 208 to maintain the time alignment of the first and second data streams 146-148. The received coded matrix module 198 functions to create the received coded matrix 204 by, when triggered, determining whether the received coded matrix 204 includes a decode threshold number of pairs of coded values and when the received coded matrix 204 does not include the decode threshold number of pairs of coded values generates a request 156 for one or more additional pairs of coded values 158, sends the request 156 to the transmitting entity 192, and receives the one or more additional pairs of coded values 158 from the transmitting entity 192.

The received coded matrix module 198 functions to determine whether the received coded matrix 204 includes the decode threshold number of pairs of coded values when triggered in a variety of ways. In a first way, the trigger includes an expiration of a predetermined time period (e.g., starting from reception of a first pair of coded values). In a second way, the trigger includes receiving an indication from the transmitting entity 192 that at least a decode threshold number of the pairs of coded values have been transmitted (e.g., a message, a slice name associated with a coded value pair of the decode threshold number of pairs of coded values). In a third way, the trigger includes determining that the at least the decode threshold number of the pairs of coded values have been transmitted based on subsequent receptions of pairs of coded values from other data segments of the first and second data streams 146-148. The received coded matrix module 198 functions to generate the request 156 for the one or more additional pairs of coded values by identifying a number of additional pairs of coded values and generating the request 156 for the number of additional pairs of coded values to include a list of slice names associated with the number of additional pairs of coded values.

When the received coded matrix 204 includes the decode threshold number of pairs of coded values the data matrix module 200 generates a data matrix from the received coded matrix 204 and an encoding matrix. The encoding matrix includes at least one of a Reed-Solomon based encoding matrix, an on-line coding based matrix, a Cauchy Reed-Solomon based encoding matrix, a forward error correction based matrix, and an erasure code based matrix. The data matrix module 200 functions to generate the data matrix from the received coded matrix 204 and the encoding matrix by several steps for each column of the received coded matrix. In a first step, the data matrix module 200 creates a received value matrix that includes a decode threshold number of coded values of the column (e.g., delete rows not utilized, resulting matrix is one column wide by a decode threshold number of rows). In a second step, the data matrix module 200 creates a square encoding matrix based on corresponding rows of the decode threshold number of coded values of the column (e.g., delete rows not utilized). In a third step, the data matrix module 200 inverts the square encoding matrix to produce an inverted square encoding matrix. In a fourth step, the data matrix module 200 matrix multiplies the received value matrix by the inverted square encoding matrix to produce a corresponding column of the data matrix.

The data matrix module 200 reproduces the one of the first plurality of data segments 206 from a first plurality of data blocks of the data matrix and reproduces the one of the second plurality of data segments 208 from a second plurality of data blocks of the data matrix, wherein the one of the first plurality of data segments 206 and the one of the second plurality of data segments 208 maintain the time alignment of the first and second data streams 146-148.

The validity module 202 determines whether the reproduced one of the first plurality of data segments 206 and the reproduced one of the second plurality of data segments 208 are valid (e.g., perform an integrity test). When the reproduced one of the first plurality of data segments 206 and the reproduced one of the second plurality of data segments 208 are valid, the validity module 202 indicates to the transmitting entity 192 that the received coded matrix includes the decode threshold number of pairs of coded values. The indicating may include one or more of outputting an indicator message 210 to the transmitting entity 192 indicating that no more coded values are required and outputting data segments in a time synchronized fashion. When the reproduced one of the first plurality of data segments 206 and the reproduce one of the second plurality of data segments 208 are not valid, the validity module 202 indicates that the received coded matrix 204 does not include the decode threshold number of pairs of coded values. The indicating may include outputting an indicator message 210 to the transmitting entity 192 indicating that more coded values are required.

Figure 10B:
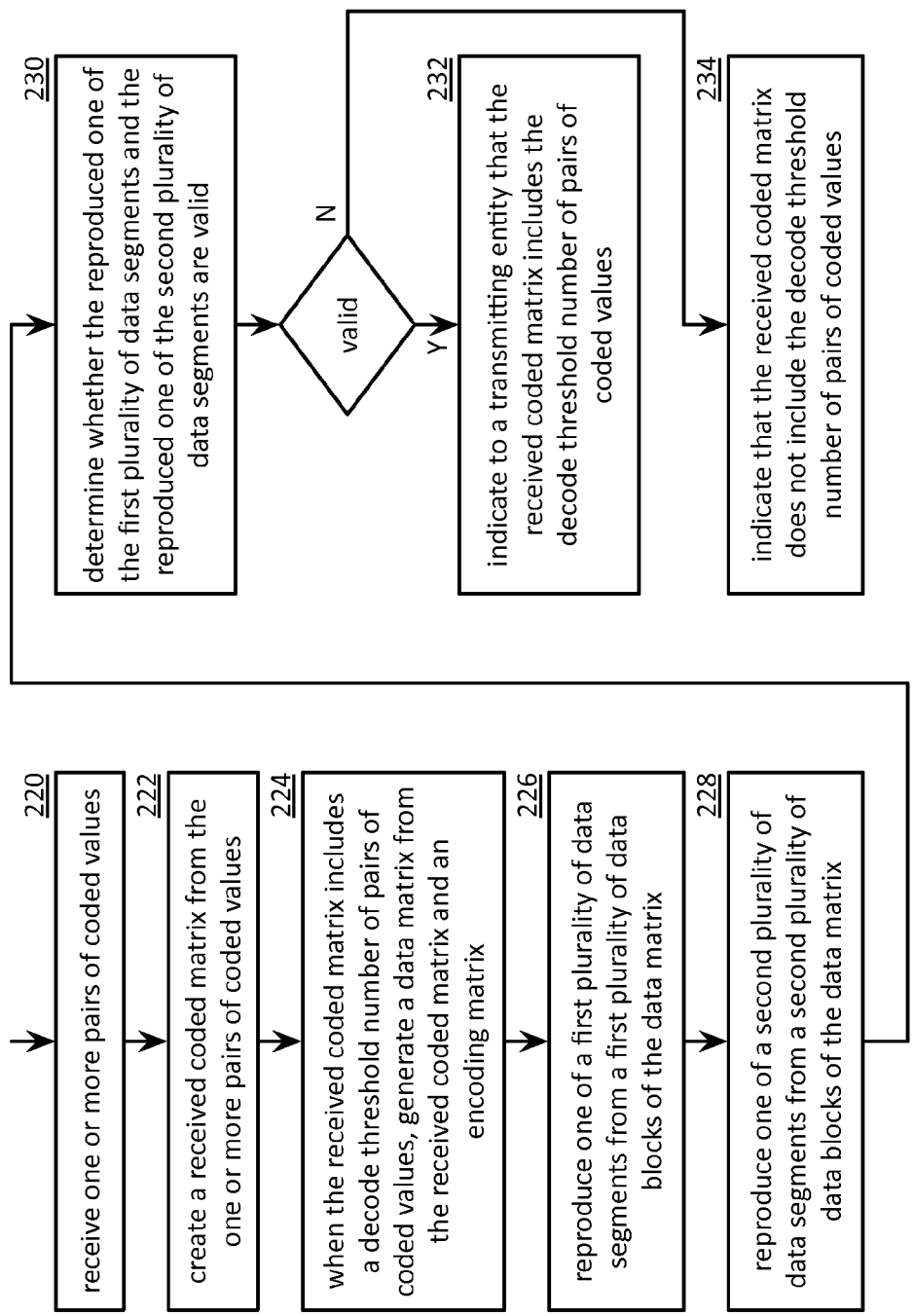
FIG. 10B is a flowchart illustrating an example of receiving data in accordance with the invention.

FIG. 10B is a flowchart illustrating an example of receiving data. The method begins at step 220 where a processing module (e.g., a dispersed storage (DS) processing module of a receiving user device) receives one or more pairs of coded values from a transmitting entity. A pair of coded values of the one or more pairs of coded values includes a coded value corresponding to one of a first plurality of data segments and a coded value corresponding to the one of a second plurality of data segments. The transmitting entity obtains the one or more pairs of coded values in a variety of ways including generating, retrieving, and receiving. When generating the one or more pairs of coded values, the transmitting entity time aligns and segments each of a first data stream and a second data stream to produce the first plurality of data segments corresponding to the first data stream and the second plurality of data segments corresponding to the second data stream. The first data stream may correspond to a first recording of an environment and the second data stream may correspond to a second recording of the environment when the first data stream corresponds to the first recording of the environment.

The method continues at step 222 wherein the processing module creates a received coded matrix from the one or more pairs of coded values. The creating the received coded matrix from the one or more pairs of coded values includes inputting pairs of coded values into the received coded matrix in a sequential order corresponding to a time ordering of the one of the first plurality of data segments and the one of the second plurality of data segments to maintain the time alignment of the first and second data streams. The time ordering may be based on one or more of time of receipt, time of transmission, time of generation, and a slice name correlation.

The creating the received coded matrix includes when triggered, determining whether the received coded matrix includes a decode threshold number of pairs of coded values. The processing module acquires one or more additional pairs of coded values when the received coded matrix does not include the decode threshold number of pairs of coded values. The acquiring includes generating a request for one or more additional pairs of coded values, sending the request to a transmitting entity, and receiving the one or more additional pairs of coded values from the transmitting entity. The generating the request for the one or more additional pairs of coded values includes identifying a number of additional pairs of coded values and generating the request for the number of additional pairs of coded values to include a list of slice names associated with the number of additional pairs of coded values.

The determining whether the received coded matrix includes the decode threshold number of pairs of coded values when triggered includes at least one of several triggers. A first trigger includes expiration of a predetermined time period. A second trigger includes receiving an indication from the transmitting entity that at least a decode threshold number of the pairs of coded values have been transmitted. A third trigger includes determining that the at least a decode threshold number of the pairs of coded values have been transmitted based on subsequent receptions of pairs of coded values from other data segments of the first and second data streams.

When the received coded matrix includes the decode threshold number of pairs of coded values, the method continues at step 224 where the processing module generates a data matrix from the received coded matrix and an encoding matrix. The encoding matrix includes at least one of a Reed-Solomon based encoding matrix, an on-line coding based matrix, a Cauchy Reed-Solomon based encoding matrix, a forward error correction based matrix, and an erasure code based matrix. The generating the data matrix from the received coded matrix and the encoding matrix includes, several steps for each column of the received coded matrix. In a first step, the processing module creates a received value matrix that includes a decode threshold number of coded values of the column. In a second step, the processing module creates a square encoding matrix based on corresponding rows of the decode threshold number of coded values of the column. In a third step, the processing module inverts the square encoding matrix to produce an inverted square encoding matrix. In a fourth step, the processing module, matrix multiplies the received value matrix by the inverted square encoding matrix to produce a corresponding column of the data matrix. The method repeats for each column of the data matrix.

The method continues at step 226 wherein the processing module reproduces the one of the first plurality of data segments from a first plurality of data blocks of the data matrix. For example, the processing module extracts a column of the data matrix to produce the one of the first plurality of data segments when a data block is one byte. The method continues at step 228 where the processing module reproduces the one of the second plurality of data segments from a second plurality of data blocks of the data matrix, wherein the one of the first plurality of data segments and the one of the second plurality of data segments maintain the time alignment of the first and second data streams. For example, the processing module extracts an adjacent column to the column of the data matrix to produce the one on the second plurality of data segments.

The method continues at step 230 where the processing module determines whether the reproduced one of the first plurality of data segments and the reproduced one of the second plurality of data segments are valid. The processing module may perform a validation to include indicating validity when a calculated integrity value is substantially the same as a retrieved integrity value for each of the data segments. The method branches to step 234 when the processing module determines that the reproduced one of the first plurality of data segments and the reproduced one of the second plurality of data segments are not valid (e.g., at least one is not valid). The method continues to step 232 when the processing module determines that the reproduced one of the first plurality of data segments and the reproduced one of the second plurality of data segments are valid.

When the reproduced one of the first plurality of data segments and the reproduced one of the second plurality of data segments are valid, the method continues at step 232 where the processing module indicates to the transmitting entity that the received coded matrix includes the decode threshold number of pairs of coded values (e.g., generating and sending a message indicator). When the reproduced one of the first plurality of data segments and the reproduced one of the second plurality of data segments are not valid, the method continues at step 234 where the processing module indicates that the received coded matrix does not include the decode threshold number of pairs of coded values.

Figure 11:
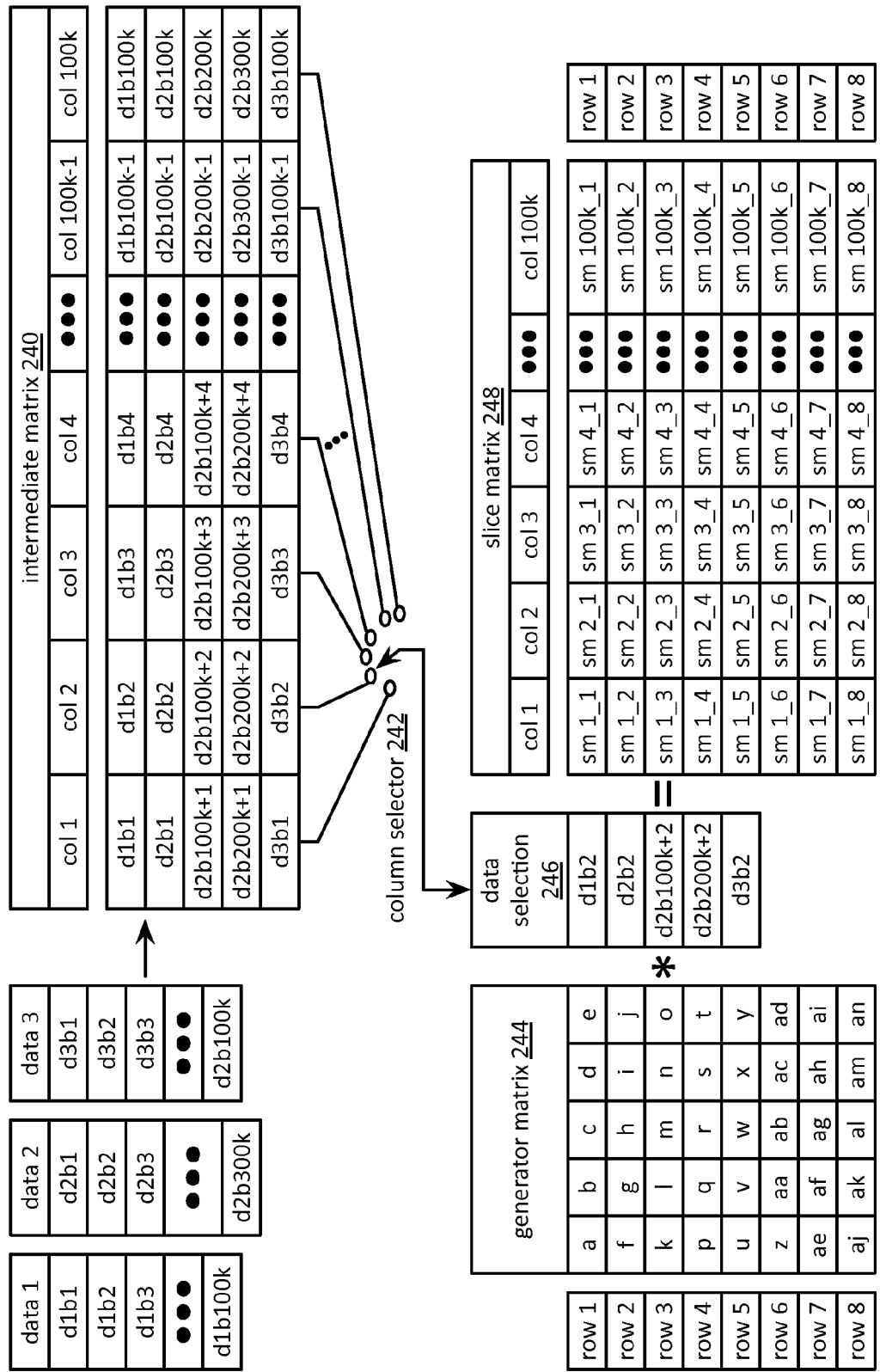
FIG. 11 is a diagram illustrating another example of a data encoding scheme in accordance with the invention.

FIG. 11 is a diagram illustrating another example of a data encoding scheme. The scheme includes data 1, data 2, data 3, an intermediate matrix 240, a column selector 242, a generator matrix 244, a data selection 246, and a slice matrix tuner 48. The data 1-3 includes two or more pluralities of data bytes. For example, data 1 includes 100,000 bytes d1$b$1-d1$b$100$k$, data 2 includes 300,000 bytes d2$b$1-d2$b$100$k$, and data 3 includes 100,000 bytes d3$b$1-d3$b$100$k$. The intermediate matrix 240 includes matrix dimensions (e.g., number of rows, number of columns) based on a size of data 1-3 and error coding dispersal storage function parameters (e.g., a decode threshold). For example, the intermediate matrix includes five rows and 100,000 columns, when the error coding dispersal storage function parameters includes a decode threshold of five and a data 1-3 size increment of 100,000 bytes each (e.g., columns=data 1, 3 size). The intermediate matrix 240 includes alternating entries between data 1, data 2, and data 3 of sequential data bytes of data 1-3 in a row-by-row fashion. For example, row 1 starts with data 1 and includes bytes d1$b$1-d1$b$100$k$, row 2 alternates to data 2 and includes bytes d2$b$1-d2$b$100$k$, row 2 continues with data 2 and includes bytes d2$b$100$k$+1-d2$b$200$k$, row 3 continues with data 2 and includes bytes d2$b$200$k$+1-d2$b$300$k$, and row 3 alternates to data 3 and includes bytes d3$b$1-d3$b$100$k$. The alternating encoding scheme facilitates subsequent time synchronization between data 1-3.

The generator matrix 244 includes matrix dimensions based on the error coding dispersal storage function parameters (e.g., the decode threshold, a width). For example, the generator matrix 244 includes five columns and eight rows when the decode threshold is five and the pillar width is eight. The generator matrix 244 includes entries in accordance with an error coding dispersal storage function to produce encoded data slices such that at least a decode threshold number of encoded data slices may be utilized to subsequently reproduce the data.

The data selection 246 includes matrix dimensions of one by the decode threshold (e.g., one by five when the decode threshold is five). The column selector 242 forms entries of the data selection 246 based on selecting data of each column of the intermediate matrix 240 one by one. For example, the column selector 242 selects a second selection of column 2 to include bytes d1$b$2, d2$b$2, d2$b$100$k$+2, d2$b$200$k$+2, and d3$b$2.

The slice matrix 248 includes matrix dimensions of a pillar width number of rows (e.g., pillars) and a number of columns is substantially the same as the number of columns of the intermediate matrix 240. The slice matrix 248 includes entries that form a pillar width number (e.g., a number of rows of the slice matrix) of encoded data slices. The encoded data slice of the width number of encoded data slices includes between one and a number of bytes substantially the same as the number of columns of the intermediate matrix 240. For example, each encoded data slice includes one byte when the slices correspond to one column of the slice matrix 248. As another example, each encoded data slice includes 100,000 bytes when the slices correspond to all columns of the slice matrix 248.

In an example of operation, the column selector 242 selects one column of the intermediate matrix 240 at a time to produce a data selection 246 of a plurality of data selections. The generator matrix 244 is multiplied by each data selection 246 of the plurality of data selections to produce a corresponding column of a plurality of columns of the slice matrix 248. For example, sm $1\_1=a*d1b1+b*d2b1+c*(d2b100k+1)+d*(d2b200k+1)+e*d3b1$ when the column selector 242 selects a first column. As another example, sm $2\_8=aj*d1b2+ak*d2b2+al*(d2b100k+2)+am*(d2b200k+2)+an*d3b2$ when the column selector 242 selects a second column.

Slices may be formed from the slice matrix 248 and transmitted to at least one receiving entity to provide a reliable transmission of the data 1-2. Slices are aligned by row and may include any number of bytes of the corresponding columns. For example, a pillar 1 (e.g., row 1) slice includes bytes sm 1_1, sm 2_1, sm 3_1, and sm 4_1 when four bytes may be transmitted together as one slice. Slices from at least a decode threshold number of rows are to be transmitted such that corresponding data selections may be reproduced by decoding a decode threshold number of bytes corresponding to a common column. More than a decode threshold number of bytes per column may be transmitted when at least one of the decode threshold number of bytes was not received by at least one receiving entity. For example, bytes of column 1 corresponding to rows 1-5 are transmitted as a first transmitting step and all bytes except the byte of row 3 are received by the receiving entity. Any one of bytes corresponding to rows 3, 6-8 may be transmitted as a second transmitting step to the receiving entity such that the receiving entity completes receiving a decode threshold number of bytes corresponding to column 1. The method of operation of a transmitting entity is discussed in greater detail with reference to FIG. 12.

Figure 12:
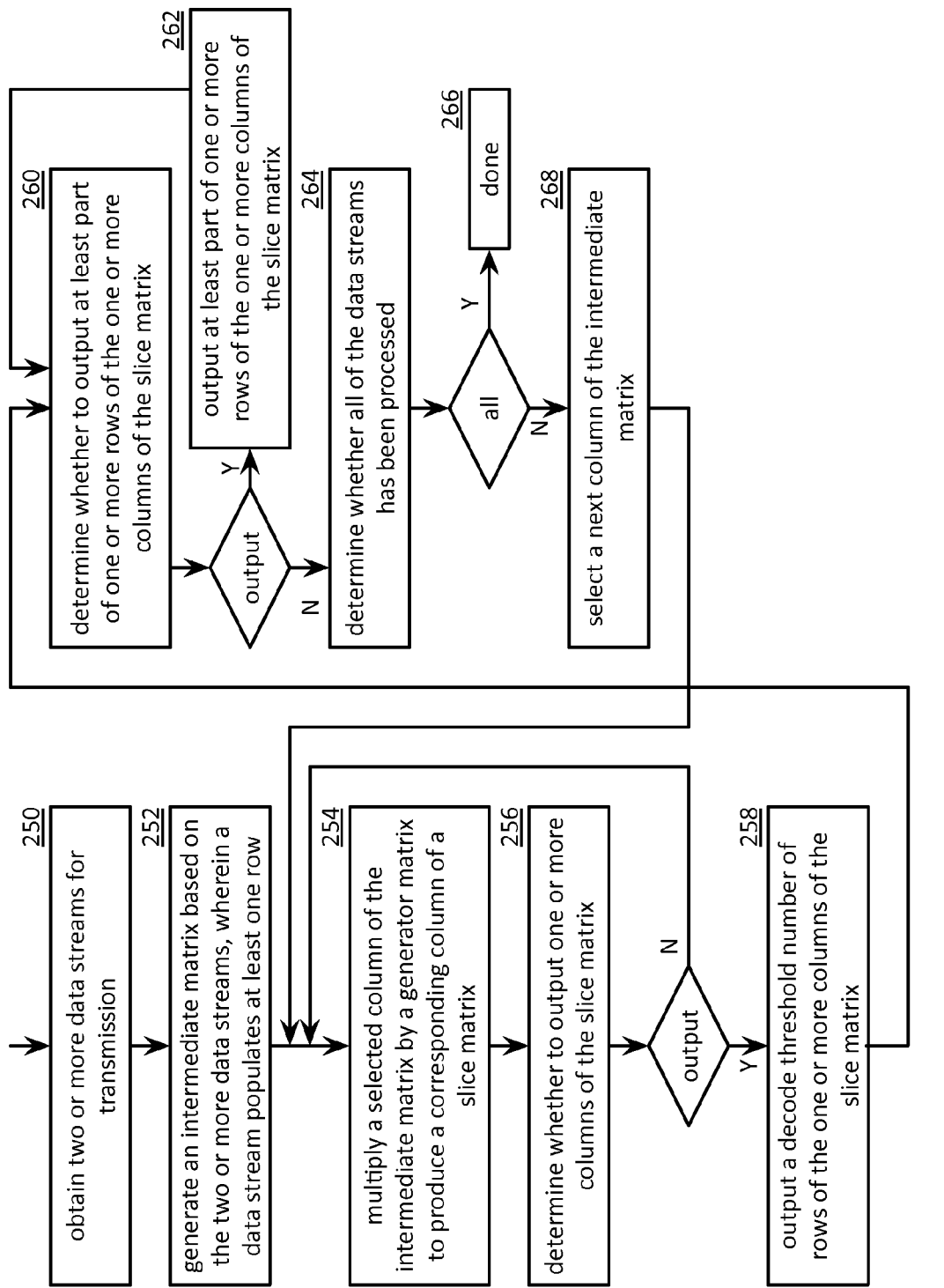
FIG. 12 is a flowchart illustrating another example of sending data in accordance with the invention.

FIG. 12 is a flowchart illustrating another example of sending data. The method begins at step 250 where a processing module (e.g., a transmitting entity such as a sending user device dispersed storage (DS) processing) obtains two or more data streams for transmission (e.g., receive, generate). The method continues at step 252 where the processing module generates an intermediate matrix based on the two or more data streams, wherein each data stream populates a set of rows. For example, the processing module generates the intermediate matrix by filling in successive rows from left to right of the intermediate matrix from bytes of each of the two or more data streams one data stream at a time.

The method continues at step 254 where the processing module matrix multiplies a selected column of the intermediate matrix by a generator matrix to produce a corresponding column of a slice matrix. The method continues at step 256 where the processing module determines whether to output one or more columns of the slice matrix based on one or more of a predetermination, a request, and a registry lookup. The method repeats back to step 254 when the processing module determines not to output the one or more columns of the slice matrix. The method continues to step 258 when the processing module determines to output the one or more columns of the slice matrix.

The method continues at step 258 where the processing module outputs a decode threshold number of rows of the one more columns of the slice matrix when the processing module determines to output the one or more columns of the slice matrix. The method continues at step 260 where the processing module determines whether to output at least part of one or more rows of the one or more columns of the slice matrix. The determination may be based on one or more of previous outputting, a predetermination, and a request. The method branches to step 264 when the processing module determines not to output the at least part of the one or more rows of the one or more columns of the slice matrix. The method continues to step 262 when the processing module determines to output the at least part of the one or more rows of the one or more columns of the slice matrix. The method continues at step 262 where the processing module outputs at least part of the one or more rows of the one or more columns of the slice matrix. The outputting may include sending integrity information corresponding to each decode threshold number of bytes of a common column (e.g., a data selection/data segment). The method loops back to step 260.

The method continues at step 264 where the processing module determines whether all the data streams have been processed based on a record of outputting. The method branches to step 268 when the processing module determines that not all of the data streams have been processed. The method concludes at step 266 when the processing module determines that all the data streams have been processed. The method continues at step 268 where the processing module selects a next column of the intermediate matrix based on previous columns sent. The method branches back to step 254.

Figure 13:
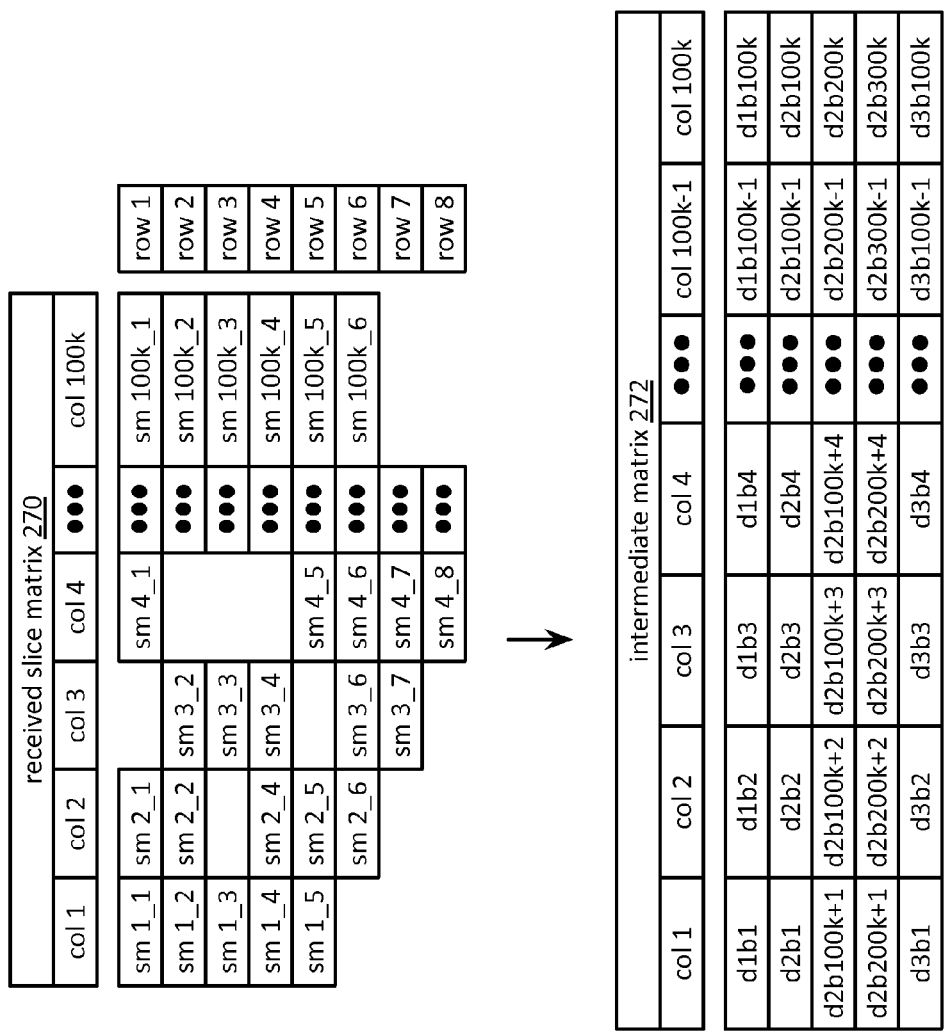
FIG. 13 is a diagram illustrating an example of a data decoding scheme in accordance with the invention.

FIG. 13 is a diagram illustrating an example of a data decoding scheme for decoding a received slice matrix 270 to produce an intermediate matrix 272. The received slice matrix 270 may be generated by a receiving entity receiving a plurality of slices from a sending entity, extracting one or more bytes from each slice of the plurality of slices, and populating the received slice matrix with the one or more bytes in accordance with a decoding scheme. For example, the received slice matrix 270 is approximately the same as a slice matrix with the exception of missing bytes due to communication errors. The receiving entity identifies one or more missing bytes and sends a message to the sending entity to send one or more additional bytes per column such that a decode threshold number of bytes per column are successfully received.

The receiving entity analyzes each column of the received slice matrix 270 to determine a message to send to the sending entity. For example, the receiving entity sends a message to the sending entity indicating that no more bytes corresponding to column 1 are required when bytes sm 1_1 through sm 1_5 were successfully received and validated (e.g., calculated integrity information favorably compares to sent integrity information). As another example, the receiving entity sends a message to the sending entity indicating that one additional byte corresponding to column 2 is required when bytes sm 2_1, sm 2_2, sm 2_4, and sm 2_5 were successfully received. Next, the receiving entity receives byte sm 2_6 corresponding to column 2 to complete a decode threshold number of bytes corresponding to column 2. Similarly, the receiving entity acquires bytes 6 and 7 of column 3 in a second receiving step when bytes 1 and 5 were missing from a first receiving step. As yet another example, the receiving entity sends a message to the sending entity indicating that at least one additional byte corresponding to column 100k is required since bytes 1-5 of column 100k produced a decoded data segment that failed an integrity test. Next, the receiving entity receives byte sm 100k_6 to utilize in combination with bytes 1-5 to attempt to decode a data segment that passes the integrity test. For each column of the received slice matrix 270, a decode threshold number of bytes are dispersed storage error decoded to produce a corresponding column of the intermediate matrix 272. The method of operation of the receiving entity is discussed in greater detail with reference to FIG. 14.

Figure 14:
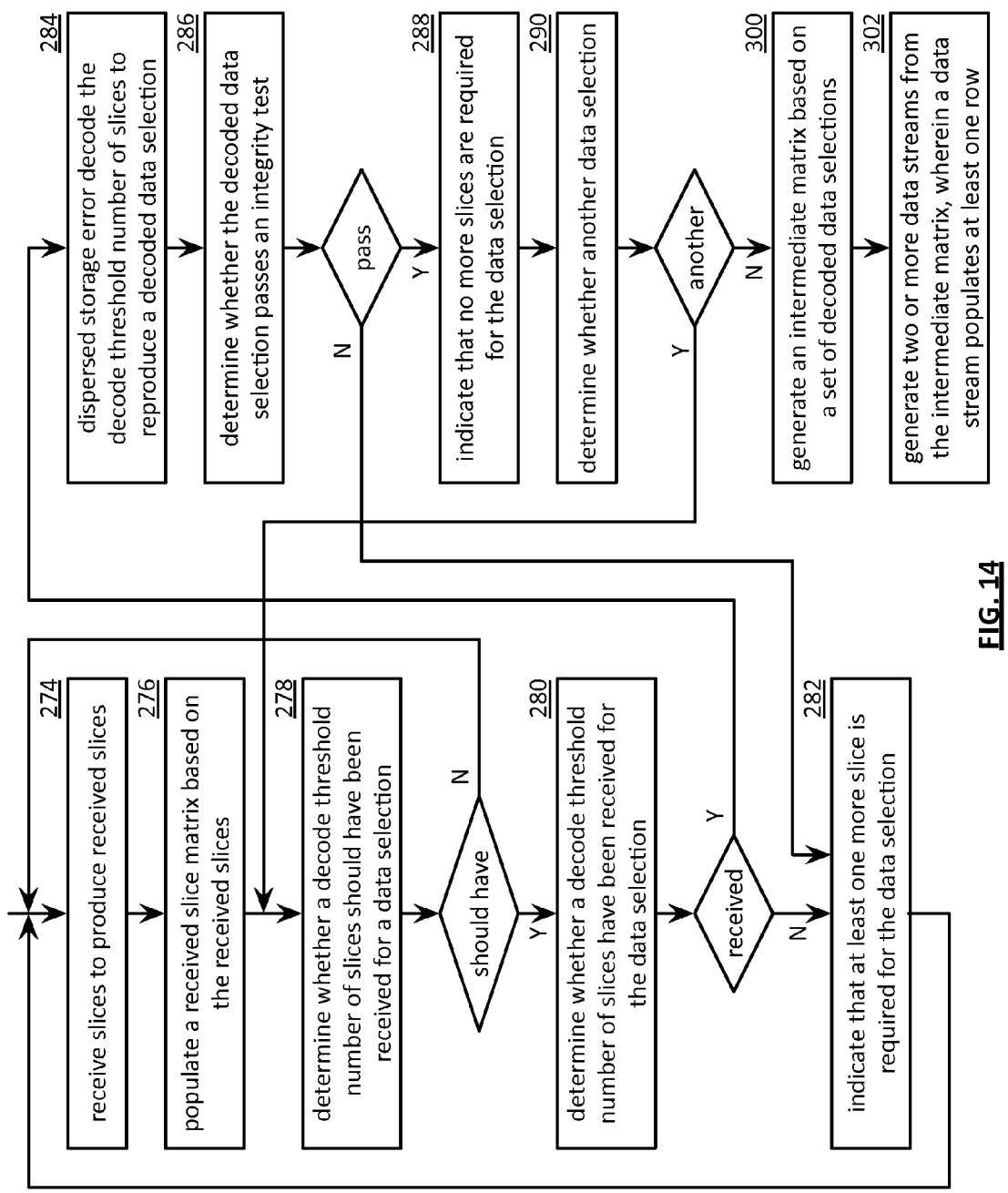
FIG. 14 is a flowchart illustrating another example of receiving data in accordance with the invention.

FIG. 14 is a flowchart illustrating another example of receiving data. The method begins at step 274 where a processing module (e.g., a receiving entity such as a receiving user device dispersed storage (DS) processing) receives slices to produce received slices. The method continues at step 276 where the processing module populates a received slice matrix with the received slices.

The method continues at step 278 where the processing module determines whether a decode threshold number of slices should have been received for a data selection. The data selection includes data bytes associated with two or more data streams rather than a data segment associated with one data stream. The determination may be based on one or more of comparing a count of a number of bytes per column to the decode threshold number, comparing a count of a number of byte positions per column to the decode threshold number, received slice names, and a decode threshold number indicator. For example, processing module determines that the decode threshold number of slices should have been received for a data selection when a slice count indicates that the decode threshold number of bytes was received. The method branches to step 280 when the processing module determines that the decode threshold number of slices should have been received. The method repeats back to step 274 when the decode threshold number of slices should not have been received so far.

The method continues at step 280 where the processing module determines whether the decode threshold number of slices have been received for the data selection. The processing module may determine that the decode threshold number of slices have been received for the data selection when a comparison of the number of received bytes of a common column of the received slice matrix to the decode threshold number is favorable (e.g., substantially the same). The method branches to step 284 when the processing module determines that the decode threshold number of slices have been received for the data selection. The method continues to step 282 when the processing module determines that the decode threshold number of slices have not been received for the data selection.

The method continues at step 282 where the processing module indicates that at least one more slice is required for the data segment. The indication includes at least one of identifying which at least one more slice is required based on which slices have been received so far and which slices have not been sent so far (e.g., higher order rows of higher order pillars) and sending a message to the sending entity that includes identification of at least one more required slice. The indication may include identification of one more bytes that are required corresponding to each of the at least one more required slice. The method repeats back to step 274.

The method continues at step 284 where the processing module dispersed storage error decodes the decode threshold number of slices to reproduce a decoded data selection when the processing module determines that the decode threshold number of slices have been received for the data selection. The processing module decodes available bytes of a common column of the received slice matrix corresponding to the data selection.

The method continues at step 286 where the processing module determines whether the decoded data segment passes an integrity test. For example, the processing module indicates passing the integrity test when a calculated integrity value (e.g., one of a hash digest of the data selection, a cyclic redundancy check of the data selection, and a mask generating function output of the data selection) compares favorably (e.g., substantially the same) to a received integrity value associated with the data selection. The method loops back to step 282 when the processing module determines that the decoded data selection does not pass the integrity test. The method continues to step 288 when the processing module determines that the decoded data selection passes the integrity test.

The method continues at step 288 where the processing module indicates that no more slices are required for the data selection. The indication includes at least one of sending a message to the sending entity that indicates that no more slices are required for the column corresponding to the data selection, storing the decode threshold number of slices in a dispersed storage network (DSN) memory, dispersed storage error encoding the data selection to reproduce a full set of slices, storing the full set of slices in the DSN memory, and sending the full set of slices to a remote user device.

The method continues at step 290 where the process module determines whether another data selection is to be reproduced. The determination may be based on one or more of verifying that each column of the received slice matrix is associated with a corresponding data selection that passes the integrity test. The method repeats back to step 278 when the processing module determines that another data selection is to be reproduced. The method continues to step 300 when the processing module determines that another data selection is not to be reproduced.

The method continues at step 300 where the processing module generates an intermediate matrix based on a set of decoded data selections decoded from each column of the received slice matrix. For example, the processing module populates each column of the intermediate matrix with a corresponding data selection of the set of decoded data selections. The method continues at step 302 where the processing module generates two or more data streams from the intermediate matrix, wherein a data stream populates at least one row. For example, the processing module partitions a first row of the intermediate matrix to produce a first data stream; a second, third, and fourth row to produce a second data stream; and a fifth row to produce a third data stream.

Figure 15:
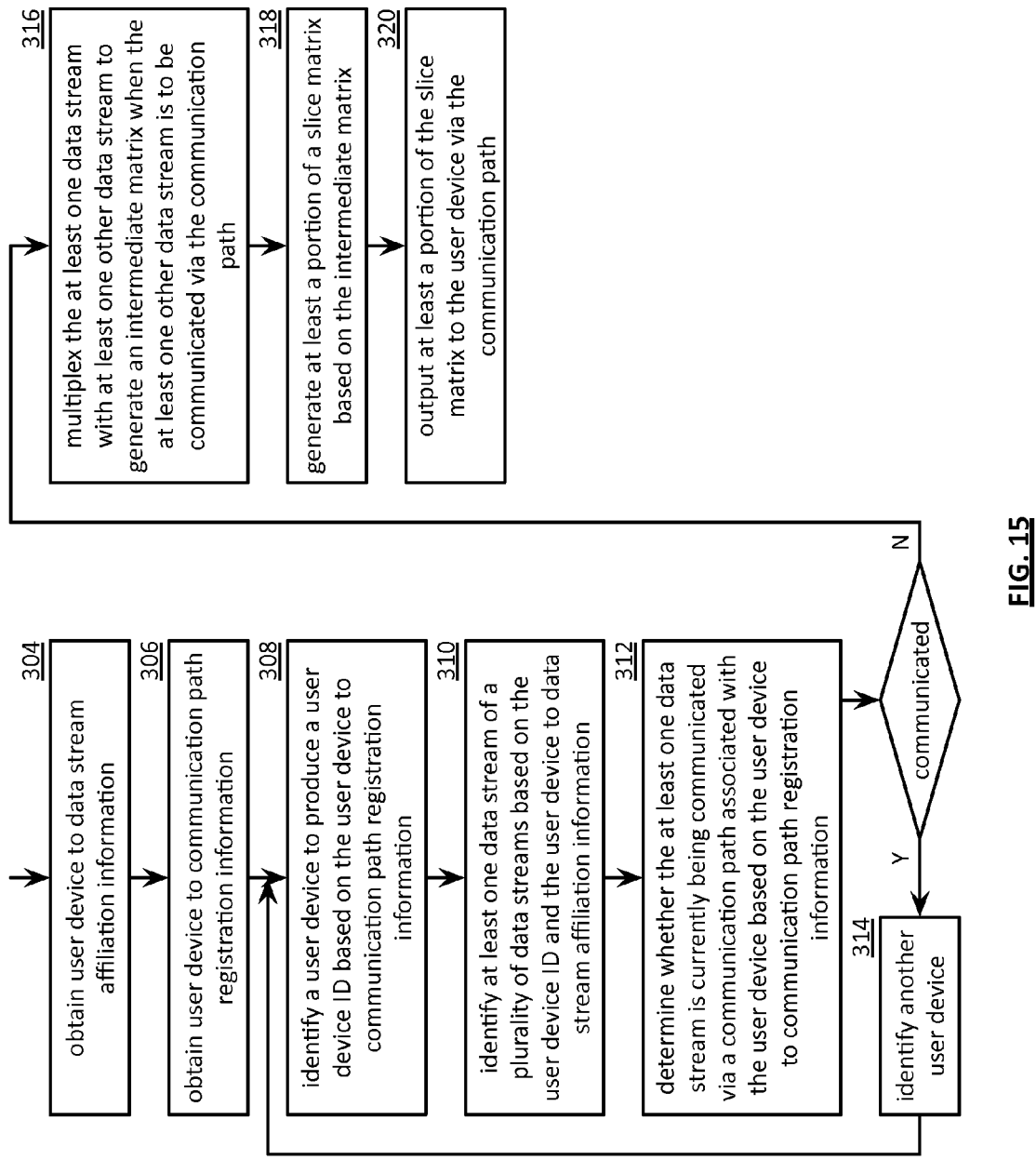
FIG. 15 is a flowchart illustrating an example of selecting a data stream in accordance with the invention.

FIG. 15 is a flowchart illustrating an example of selecting a data stream. The method begins at step 304 where a processing module (e.g., a sending entity such as a sending user device dispersed storage (DS) processing) obtains user device to data stream affiliation information. The affiliation information includes at least one user device identifier (ID) and an associated data stream ID that the user device desires to receive. The obtaining includes at least one of a lookup, a query, and receiving the affiliation information.

The method continues at step 306 where the processing module obtains user device to communication path registration information. The registration information includes one or more of user device location information, user device to wireless site registration information, at least one user device ID, and a corresponding communication path ID, wherein a user device of the user device ID may receive communications via a communication path associated with the communication path ID. The obtaining includes at least one of a lookup, a query, and receiving the registration information.

The method continues at step 308 where the processing module identifies a user device to produce a user device ID based on the user device to communication path registration information. The identification includes at least one of identifying a next user device ID from a list of user device IDs, a lookup of the user device ID in a communication path table, accessing the communication path registration information.

The method continues at step 310 where the processing module identifies at least one data stream of a plurality of data streams based on the user device ID and the user device to data stream affiliation information. The identifying includes at least one of selecting a data stream ID associated with the user ID from the user device to data stream inflation information, a query, and receiving a data stream selection message.

The method continues at step 312 where the processing module determines whether the at least one data stream is currently being communicated via a communication path associated with user device based on the user device to communication path registration information. For example, the processing module determines that the at least one data stream is being communicated one a data stream ID associated with the data stream is in an active data stream table associated with the communication path. The method branches to step 316 when the processing module determines that the at least one data stream is not being communicated. The method continues to step 314 when the processing module determines that the at least one data stream is being communicated. The method continues at step 314 where the processing module identifies another user device (e.g., a next user device ID in a list of user device IDs associated with the communication path). The method branches back to step 308.

The method continues at step 316 where the processing module multiplexes the at least one data stream with at least one other data stream to generate an intermediate matrix when at least one other data stream is to be communicated via the communication path. The multiplexing includes at least one of creating a new intermediate matrix when no other data streams exist and integrating the at least one data stream with the at least one other data stream when the other data stream exists and the intermediate matrix already exists.

The method continues at step 318 where the processing module generates at least a portion of a slice matrix based on the intermediate matrix. For example, the processing module generates at least enough columns of the slice matrix to transmit in a next broadcast transmission. The method continues at step 320 where the processing module outputs at least a portion of the slice matrix to the user device via the communication path. The outputting includes sending at least a decode threshold number of slices per column such that an integrity test of a corresponding decoded data selection/data segment by a receiving entity passes an integrity test.

Figure 16A:
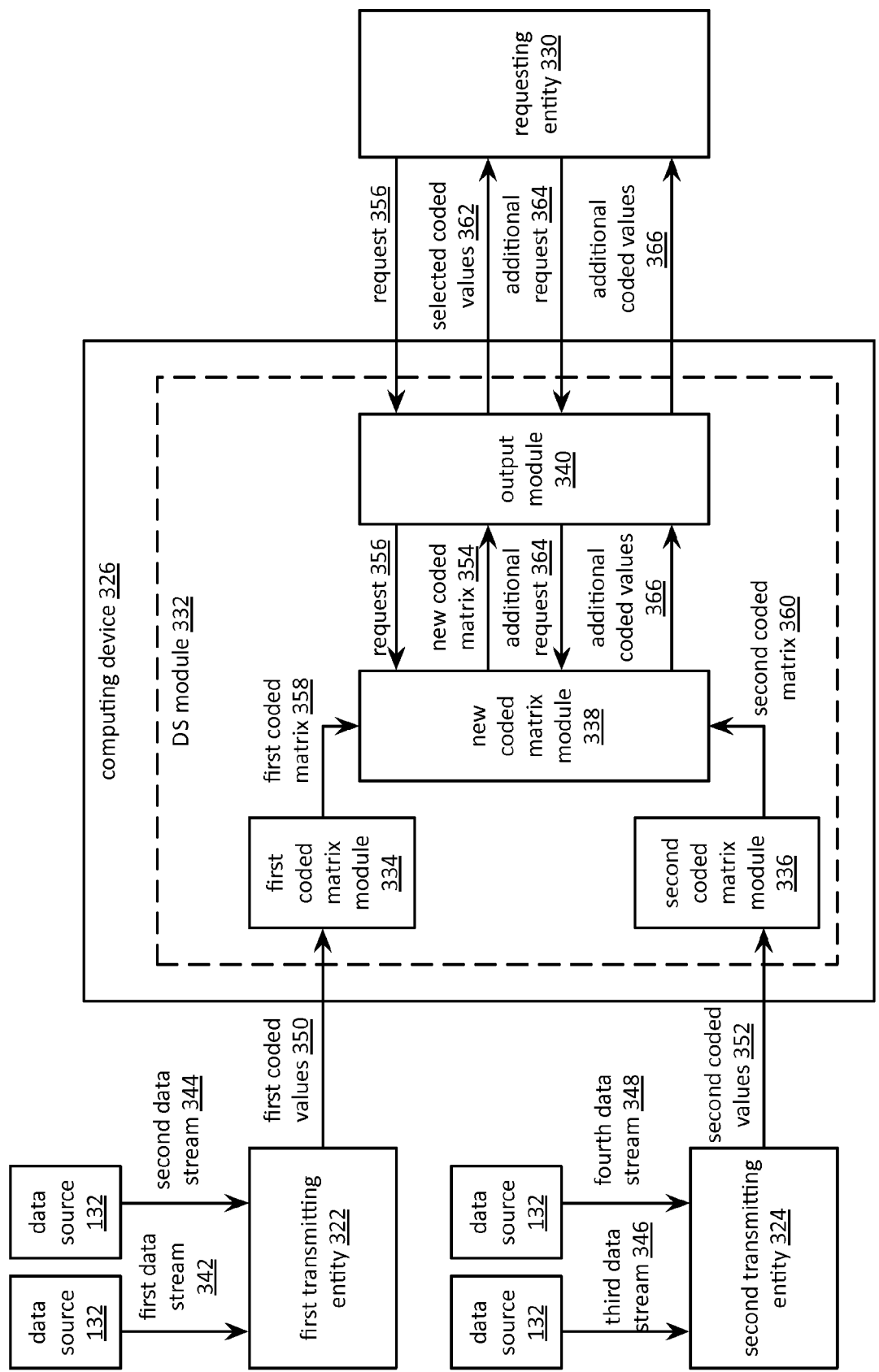
FIG. 16A is a schematic block diagram of another embodiment of a computing system in accordance with the invention.

FIG. 16A is a schematic block diagram of another embodiment of a computing system that includes a plurality of data sources 132, a first transmitting entity 322, a second transmitting entity 324, a computing device 326, and a requesting entity 330. The first and second transmitting entities 322-324 include one or more sending user devices 102. The computing device 326 may be implemented as a relay unit 106. The computing device 326 includes a dispersed storage (DS) module 332. The DS module 332 includes a first coded matrix module 334, a second coded matrix module 336, a new coded matrix module 338, and an output module 340.

A first data source 132 of the plurality of data sources 132 outputs a first data stream 342 and a second data source 132 of the plurality of data sources 132 outputs a second data stream 344 to the first transmitting entity 322. A third data source 132 of the plurality of data sources 132 outputs a third data stream 346 and a fourth data source 132 of the plurality of data sources 132 outputs a fourth data stream 348 to the second transmitting entity 324. Alternatively, at least one of the first transmitting entity 322 and the second transmitting entity 324 receives the first data stream 342, the second data stream 344, the third data stream 346, and the fourth data stream 348 from the plurality of data sources 132. The first data stream may correspond to a first recording of an environment from a first recording device (e.g., the first transmitting entity 322). The second data stream may correspond to a second recording of the environment from the first recording device. The third data stream may correspond to a third recording of the environment from a second recording device (e.g., the second transmitting entity 324). The fourth data stream may correspond to a fourth recording of the environment from the second recording device.

The first transmitting entity 322 segments the first data stream 342 and the second data stream 344 to produce a first data segment of the first data stream 342 and a first data segment of the second data stream 344. The first transmitting entity 322 divides the first data segment of the first data stream 342 to produce a first plurality of data blocks. The first transmitting entity 322 divides the first data segment of the second data stream 344 to produce a second plurality of data blocks. The first transmitting entity 322 creates a first data matrix utilizing the first and second plurality of data blocks. The first transmitting entity 322 generates a first coded matrix 358 from the data matrix and an encoding matrix (e.g., matrix multiplying). The encoding matrix includes at least one of a Reed-Solomon based encoding matrix, an on-line coding based matrix, a Cauchy Reed-Solomon based encoding matrix, a forward error correction based matrix, and an erasure code based matrix. The first transmitting entity 322 outputs a first plurality of pairs of coded values 350 corresponding to the first data segments of the first data stream 342 and the second data stream 344 by extracting the first plurality of pairs of coded values 350 from adjacent columns of the first coded matrix 358.

The second transmitting entity 324 segments the third data stream 346 and the fourth data stream 348 to produce a first data segment of the third data stream 346 and a first data segment of the fourth data stream 348. The second transmitting entity 324 divides the first data segment of the third data stream 346 to produce a third plurality of data blocks. The second transmitting entity 324 divides the first data segment of the fourth data stream 348 to produce a fourth plurality of data blocks. The second transmitting entity 324 creates a second data matrix utilizing the third and fourth plurality of data blocks. The second transmitting entity 324 generates a second coded matrix 360 from the second data matrix and the encoding matrix. The second transmitting entity 324 outputs a second plurality of pairs of coded values 352 corresponding to the first data segments of the third data stream 346 and the fourth data stream 348 by extracting the second plurality of pairs of coded values 352 from adjacent columns of the second coded matrix 360.

The first coded matrix module 334 receives (e.g., from one of the first transmitting entity 322 and the second transmitting entity 324) the first coded matrix 358 that includes the first plurality of pairs of coded values 350 corresponding to first data segments of the first data stream 342 and the second data stream 344. A pair of coded values of the first plurality of pairs of coded values 350 includes a first coded value corresponding to the first data segment of the first data stream 342 and a second coded value corresponding to the first data segment of the second data stream 344.

The second coded matrix module 336 receives the second coded matrix 360 that includes the second plurality of pairs of coded values 352 corresponding to first data segments of the third data stream 346 and the fourth data stream 348. A pair of coded values of the second plurality of pairs of coded values 352 includes a third coded value corresponding to the first data segment of the third data stream 346 and a fourth coded value corresponding to the first data segment of the fourth data stream 348. The first data segments of the first, second, third, and fourth data streams are time aligned based on at least one of simultaneous encoding, simultaneous transmission, time alignment by coded value identifier, time alignment by a slice name, coded value pairing, and a timestamp.

The new coded matrix module 338 may determine to generate a new coded matrix 354 based on one or more of a variety of ways. In a first way, the new coded matrix module 338 generates the new coded matrix 354 based on a request 356 from the requesting entity 330 (e.g., a request for two or more data streams). In a second way, the new coded matrix module 338 generates the new coded matrix 354 based on capabilities of the requesting entity 330 (e.g., communications path bandwidth to the requesting entity, decoding capability of the requesting entity). In a third way, the new coded matrix module 338 generates the new coded matrix 354 based on a predetermination (e.g., fixed data stream selections). In a fourth way, the new coded matrix module 338 generates the new coded matrix 354 based on a request from at least one of the first transmitting entity 322 and the second transmitting entity 324. The new coded matrix module 338 generates the new coded matrix 354 to include a plurality of groups of selected coded values 362. One of the plurality of groups of selected coded values includes at least two of the first, second, third, and fourth coded values. For example, the new coded matrix module 338 generates the new coded matrix 354 to include a plurality of groups of selected coded values that includes coded values associated with the second data stream 344 and the third data stream 346 when the request 356 indicates to send a plurality of groups of selected coded values 362 associated with the second data stream 344 and the third data stream 346.

The output module 340 outputs the plurality of groups of selected coded values 362 to the requesting entity 330 in a manner to maintain the time alignment of the first data segments of the first, second, third, and fourth data streams (e.g., coded values of pairs of coded values are in time alignment). The output module 340 determines time alignment of the first data segments of the first, second, third, and fourth data streams in a variety of ways. In a first way, the output module 340 determines time alignment by interpreting time-stamp information (e.g., time-stamp per coded value). In a second way, the output module 340 determines time alignment by interpreting naming information of the first data segment of the first, second, third, and fourth data streams. The naming information includes at least one of slice names, coded value identifiers, group names, and sequence numbers.

When the requesting entity 330 requires more coded values, the new coded matrix module 338 receives a request 364 from the requesting entity for one or more additional groups of selected coded values (e.g., by data stream identifier, by coded value names, by group ID) and generates the one or more additional groups of selected coded values 366 utilizing the first and second coded matrixes 358-360. When the one or more additional groups of selected coded values 366 are not available within the new coded matrix 354, the new coded matrix module 338 rebuilds the one or more additional groups of selected coded values 366. The rebuilding includes decoding a decode threshold number of associated groups of selected coded values to produce a data segment and encoding the data segment to produce the one or more additional groups of selected coded values. The output module 340 outputs the one or more additional groups of selected coded values 366 to the requesting entity 330.

Figure 16B:
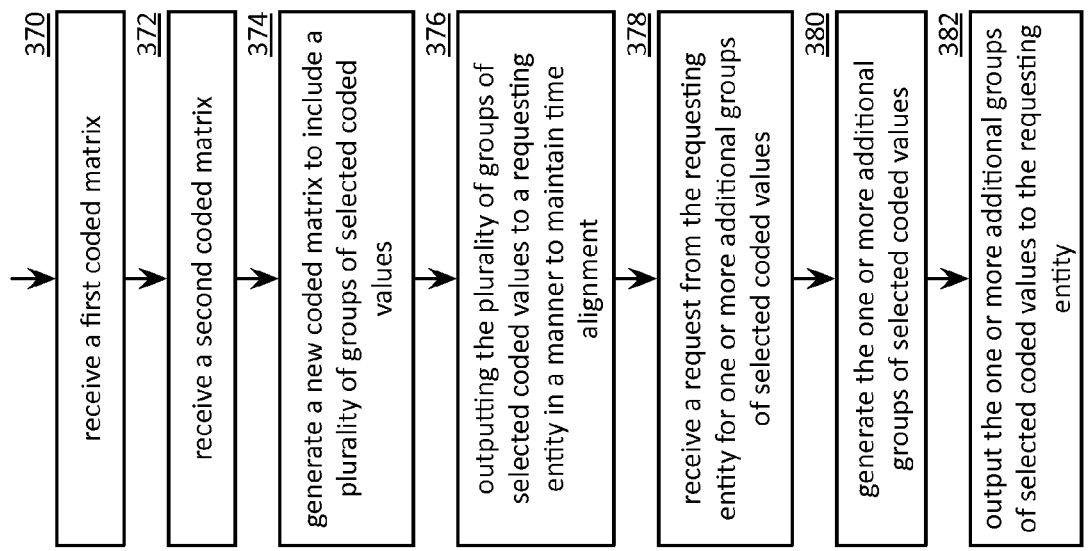
FIG. 16B is a flowchart illustrating an example of relaying data in accordance with the invention.

FIG. 16B is a flowchart illustrating an example of relaying data. The method begins at step 370 where a processing module (e.g., of a dispersed storage (DS) processing module of a relay unit) receives a first coded matrix that includes a first plurality of pairs of coded values corresponding to first data segments of a first data stream and a second data stream. A pair of coded values of the first plurality of pairs of coded values includes a first coded value corresponding to the first data segment of the first data stream and a second coded value corresponding to the first data segment of the second data stream. The first data segment of the first data stream is divided into a first plurality of data blocks and the first data segment of the second data stream is divided into a second plurality of data blocks, wherein the first and second plurality of data blocks create a first data matrix. The first coded matrix is generated from the data matrix and an encoding matrix. The first data stream may correspond to a first recording of an environment from a first recording device. The second data stream may correspond to a second recording of the environment from the first recording device.

The method continues at step 372 or the processing module receives a second coded matrix that includes a second plurality of pairs of coded values corresponding to first data segments of a third data stream and a fourth data stream. A pair of coded values of the second plurality of pairs of coded values includes a third coded value corresponding to the first data segment of the third data stream and a fourth coded value corresponding to the first data segment of the fourth data stream. The first data segment of the third data stream is divided into a third plurality of data blocks and the first data segment of the fourth data stream is divided into a fourth plurality of data blocks, wherein the third and fourth plurality of data blocks create a second data matrix. The second coded matrix is generated from the second data matrix and the encoding matrix.

The third data stream may correspond to a third recording of the environment from a second recording device. The fourth data stream may correspond to a fourth recording of the environment from the second recording device. The first data segments of the first, second, third, and fourth data streams may be time aligned. The processing module may determine the time alignment of the first data segments of the first, second, third, and fourth data streams by at least one of interpreting time-stamp information, interpreting naming information of the first data segment of the first, second, third, and fourth data streams.

The method continues at step 374 where the processing module generates a new coded matrix to include a plurality of groups of selected coded values. One of the plurality of groups of selected coded values includes at least two of the first, second, third, and fourth coded values. The processing module may generate the new coded matrix based on at least one of a request from the requesting entity and capabilities of the requesting entity. The method continues at step 376 where the processing module outputs the plurality of groups of selected coded values to a requesting entity in a manner to maintain the time alignment of the first data segments of the first, second, third, and fourth data streams.

The method continues at step 378 where the processing module receives a request from the requesting entity for one or more additional groups of selected coded values. The method continues at step 380 where the processing module generates the one or more additional groups of selected coded values utilizing the first and second coded matrixes. The method continues at step 382 where the processing module outputs the one or more additional groups of selected coded values to the requesting entity.

FIG. 17 is a flowchart illustrating another example of receiving data, which include similar steps to FIG. 14. The method begins with steps 274-276 of FIG. 14 where a processing module (e.g., a receiving entity such as a receiving user device dispersed storage (DS) processing) receives slices to produce received slices and populates a received slice matrix based on the received slices. The method continues at step 388 where the processing module identifies desired columns of the received slice matrix based on a desire data stream. The identifying may be based on one or more of an encoding scheme, a decoding scheme, a number of data streams, a desired data stream indicator, a data stream position indicator, and a message.

The method continues at step 390 where the processing module determines whether the decode threshold number of slices per desired column of the received slice matrix pass an integrity test. The processing module indicates passing the integrity test when a calculated integrity value of a decoded data segment/selection (e.g., dispersed storage every decoded from the decode threshold number of slices of a desired column) compares favorably to a received integrity value of the data segment/selection. The method branches to step 392 when the processing module determines that the decode threshold number of slices per desired column passes the integrity test. The method loops back to step 274 of FIG. 14 to receive more slices when the processing module determines that the decode threshold number of slices per desired column fails the integrity test.

The method continues at step 392 where the processing module dispersed storage error decodes each decode threshold number of slices per desired column to produce corresponding decoded data selections reproducing at least a portion of a slice matrix. As such, undesired columns (e.g., corresponding only to one or more undesired data streams) are skipped. The method continues at step 394 where the processing module generates an intermediate matrix based on the at least a portion of the slice matrix. The processing module generates the intermediate matrix by populating the intermediate matrix with the decoded data selections in accordance with at least one of a data encoding scheme, a data multiplexing scheme, and a data decoding scheme. The method continues at step 396 where the processing module extracts the desired data stream from the intermediate matrix. The extracting may be based on one or more of the desired data stream indicator, the data multiplexing scheme, a predetermination, and a de-multiplexing instruction.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
    receiving a first coded matrix that includes a first plurality of pairs of coded values corresponding to first data segments of a first data stream and a second data stream, wherein a pair of coded values of the first plurality of pairs of coded values includes a first coded value corresponding to the first data segment of the first data stream and a second coded value corresponding to the first data segment of the second data stream;
    receiving a second coded matrix that includes a second plurality of pairs of coded values corresponding to first data segments of a third data stream and a fourth data stream, wherein a pair of coded values of the second plurality of pairs of coded values includes a third coded value corresponding to the first data segment of the third data stream and a fourth coded value corresponding to the first data segment of the fourth data stream, wherein the first data segments of the first, second, third, and fourth data streams are time aligned;
    generating a new coded matrix to include a plurality of groups of selected coded values, wherein one of the plurality of groups of selected coded values includes at least two of the first, second, third, and fourth coded values; and
    outputting the plurality of groups of selected coded values to a requesting entity in a manner to maintain the time alignment of the first data segments of the first, second, third, and fourth data streams.

2. The method of claim 1 further comprises:
    generating the new coded matrix based on a request from the requesting entity.

3. The method of claim 1 further comprises:
    generating the new coded matrix based on capabilities of the requesting entity.

4. The method of claim 1 further comprises:
    the first data stream corresponding to a first recording of an environment from a first recording device;
    the second data stream corresponding to a second recording of the environment from the first recording device;
    the third data stream corresponding to a third recording of the environment from a second recording device; and
    the fourth data stream corresponding to a fourth recording of the environment from the second recording device.

5. The method of claim 1 further comprises:
    determining the time alignment of the first data segments of the first, second, third, and fourth data streams by at least one of:
        interpreting time-stamp information; and
        interpreting naming information of the first data segment of the first, second, third, and fourth data streams.

6. The method of claim 1 further comprises:
    receiving a request from the requesting entity for one or more additional groups of selected coded values;
    generating the one or more additional groups of selected coded values utilizing the first and second coded matrixes; and outputting the one or more additional groups of selected coded values to the requesting entity.

7. The method of claim 1 further comprises:

the first plurality of pairs of coded values corresponding to the first data segments of the first data stream and the second data stream, wherein the first data segment of the first data stream is divided into a first plurality of data blocks and the first data segment of the second data stream is divided into a second plurality of data blocks, wherein the first and second plurality of data blocks create a first data matrix, and wherein the first coded matrix is generated from the data matrix and an encoding matrix; and the second plurality of pairs of coded values corresponding to the first data segments of the third data stream and the fourth data stream, wherein the first data segment of the third data stream is divided into a third plurality of data blocks and the first data segment of the fourth data stream is divided into a fourth plurality of data blocks, wherein the third and fourth plurality of data blocks create a second data matrix, and wherein the second coded matrix is generated from the second data matrix and the encoding matrix.

8. A dispersed storage (DS) module comprises:

a first module, when operable within a computing device, causes the computing device to:
receive a first coded matrix that includes a first plurality of pairs of coded values corresponding to first data segments of a first data stream and a second data stream, wherein a pair of coded values of the first plurality of pairs of coded values includes a first coded value corresponding to the first data segment of the first data stream and a second coded value corresponding to the first data segment of the second data stream;

a second module, when operable within the computing device, causes the computing device to:
receive a second coded matrix that includes a second plurality of pairs of coded values corresponding to first data segments of a third data stream and a fourth data stream, wherein a pair of coded values of the second plurality of pairs of coded values includes a third coded value corresponding to the first data segment of the third data stream and a fourth coded value corresponding to the first data segment of the fourth data stream, wherein the first data segments of the first, second, third, and fourth data streams are time aligned;

a third module, when operable within the computing device, causes the computing device to:
generate a new coded matrix to include a plurality of groups of selected coded values, wherein one of the plurality of groups of selected coded values includes at least two of the first, second, third, and fourth coded values; and a fourth module, when operable within the computing device, causes the computing device to:
output the plurality of groups of selected coded values to a requesting entity in a manner to maintain the time alignment of the first data segments of the first, second, third, and fourth data streams.

9. The DS module of claim 8 further comprises:
the third module functions to generate the new coded matrix based on a request from the requesting entity.

10. The DS module of claim 8 further comprises:
the third module functions to generate the new coded matrix based on capabilities of the requesting entity.

11. The DS module of claim 8 further comprises:
the first data stream corresponding to a first recording of an environment from a first recording device;
the second data stream corresponding to a second recording of the environment from the first recording device;
the third data stream corresponding to a third recording of the environment from a second recording device; and
the fourth data stream corresponding to a fourth recording of the environment from the second recording device.

12. The DS module of claim 8 further comprises:
the fourth module is further operable to determine the time alignment of the first data segments of the first, second, third, and fourth data streams by at least one of:
interpreting time-stamp information; and
interpreting naming information of the first data segment of the first, second, third, and fourth data streams.

13. The DS module of claim 8 further comprises:
the third module is further operable to:
receive a request from the requesting entity for one or more additional groups of selected coded values;
generate the one or more additional groups of selected coded values utilizing the first and second coded matrixes; and
the fourth module is further operable to output the one or more additional groups of selected coded values to the requesting entity.

14. The DS module of claim 8 further comprises:
the first plurality of pairs of coded values corresponding to the first data segments of the first data stream and the second data stream, wherein the first data segment of the first data stream is divided into a first plurality of data blocks and the first data segment of the second data stream is divided into a second plurality of data blocks, wherein the first and second plurality of data blocks create a first data matrix, and wherein the first coded matrix is generated from the data matrix and an encoding matrix; and the second plurality of pairs of coded values corresponding to the first data segments of the third data stream and the fourth data stream, wherein the first data segment of the third data stream is divided into a third plurality of data blocks and the first data segment of the fourth data stream is divided into a fourth plurality of data blocks, wherein the third and fourth plurality of data blocks create a second data matrix, and wherein the second coded matrix is generated from the second data matrix and the encoding matrix.

* * * * *